United States Patent
Li et al.

(10) Patent No.: US 7,608,888 B1
(45) Date of Patent: Oct. 27, 2009

(54) FIELD EFFECT TRANSISTOR

(75) Inventors: Jian Li, Sunnyvale, CA (US); Ho-Yuan Yu, Saratoga, CA (US)

(73) Assignee: Qspeed Semiconductor Inc., Santa Clara, CA (US)

( * ) Notice: Subject to any disclaimer, the term of this patent is extended or adjusted under 35 U.S.C. 154(b) by 600 days.

(21) Appl. No.: 11/149,716

(22) Filed: Jun. 10, 2005

Related U.S. Application Data

(60) Provisional application No. 60/578,963, filed on Jun. 10, 2004.

(51) Int. Cl.
*H01L 29/76* (2006.01)
(52) U.S. Cl. .................. 257/328; 257/329; 257/330
(58) Field of Classification Search .............. 257/328, 257/329, 330
See application file for complete search history.

(56) References Cited

U.S. PATENT DOCUMENTS

| | | | |
|---|---|---|---|
| 5,581,100 A * | 12/1996 | Ajit ........................... | 257/331 |
| 6,060,746 A * | 5/2000 | Bertin et al. ................ | 257/331 |
| 6,251,751 B1 * | 6/2001 | Chu et al. ................... | 438/439 |
| 6,916,745 B2 * | 7/2005 | Herrick et al. .............. | 438/700 |
| 2005/0148128 A1 * | 7/2005 | Pattanayak et al. .......... | 438/197 |

* cited by examiner

*Primary Examiner*—Samuel A Gebremariam
(74) *Attorney, Agent, or Firm*—Morgan, Lewis & Bockius LLP

(57) ABSTRACT

A field effect transistor (FET), in accordance with one embodiment, includes a first semiconductor layer, a first dielectric layer, a second semiconductor layer, a second dielectric layer and a third semiconductor layer. The first dielectric layer may be disposed upon the first semiconductor layer, wherein the first semiconductor layer has a first conductivity type. The second semiconductor layer, having a second conductivity type, may be disposed upon the first dielectric layer. The second dielectric layer may be disposed upon the second semiconductor layer. The third semiconductor layer, having a first conductivity type, may be disposed upon the first semiconductor layer between a first and second portion of the first dielectric layer, a first and second portion of the second semiconductor layer and a first and second portion of the second dielectric layer. The FET may also include a third dielectric layer disposed between the third semiconductor layer and the first and second portions of the second semiconductor layer.

17 Claims, 17 Drawing Sheets

FIELD EFFECT TRANSISTOR

CROSS-REFERENCE TO RELATED APPLICATIONS

This application claims the benefit of U.S. Provisional Application 60/578,963 filed Jun. 10, 2004.

BACKGROUND OF THE INVENTION

Conventional integrated circuits are fabricated utilizing a number of basic processing steps such as deposition, doping, etching, photolithography and the like. The processes are utilized to form various device structures, such as gates, drains, sources and the like, that makeup a given integrated circuit. Continued advancements in semiconductor fabrication techniques enable continued improvements in device structure of the integrated circuits.

Improvements in the device structure results in improved devices. For example, reducing the channel length of a transistor may result in increased switching speed, reduced power consumption and the like. In the conventional art, processes such as doping, photolithography and the like typically determine the minimum feature size of device structures. For example, a photolithography process typically defines the source and drain regions and therefore the channel length of a transistor.

However, the minimum feature size of structures formed utilizing a photolithography process has reached a limit due to the wavelength of the light used to activate the photoresist. Accordingly, continued scaling of semiconductor devices has become problematic.

SUMMARY OF THE INVENTION

Embodiments of the present invention relate to field effect transistors and methods of manufacturing the devices, wherein a photolithography process does not limit the minimum feature size of the gate and channel length. In one embodiment, a field effect transistor (FET) includes a first semiconductor layer, a first dielectric layer, a second semiconductor layer, a second dielectric layer and a third semiconductor layer. The first dielectric layer may be disposed upon the first semiconductor layer, wherein the first semiconductor layer has a first conductivity type. The second semiconductor layer, having a second conductivity type, may be disposed upon the first dielectric layer. The second dielectric layer may be disposed upon the second semiconductor layer. The third semiconductor layer, having a first conductivity type, may be disposed upon the first semiconductor layer between a first and second portion of the first dielectric layer, a first and second portion of the second semiconductor layer and a first and second portion of the second dielectric layer. The FET may also include a third dielectric layer disposed between the third semiconductor layer and the first and second portions of the second semiconductor layer.

In another embodiment, a method of fabrication a FET includes depositing a first dielectric layer upon a first semiconductor layer. A second semiconductor layer is deposited upon the first dielectric layer. A second dielectric layer is deposited upon the second semiconductor layer. A trench is etched through the second dielectric layer, the second semiconductor layer and the first dielectric layer. A third semiconductor is deposited in the trench. The first and third semiconductor layers may have a first conductivity type. The second semiconductor layer may have a second conductivity type.

Embodiments of the present invention also advantageously provide a FET having a gate (e.g., second semiconductor layer) thickness that is a function of a thin film deposition process. The channel length of the FET is advantageously a function of the gate thickness. Accordingly, a photolithography process does not limit the minimum feature size of the channel of the FET.

BRIEF DESCRIPTION OF THE DRAWINGS

Embodiments of the present invention are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it is understood that the present invention may be practiced without these specific details. In other instances, well known methods, procedures, components, and circuits have not been described in detail as not to unnecessarily obscure aspects of the present invention.

Figure 1:
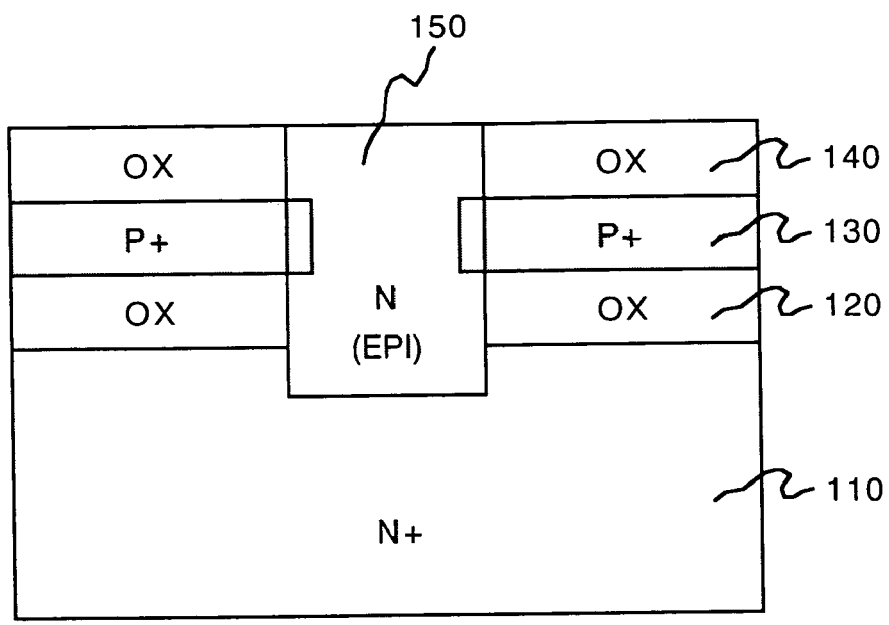
FIG. 1 shows a block diagram of a field effect transistor (FET), in accordance with one embodiment of the present invention.
Figure 2:
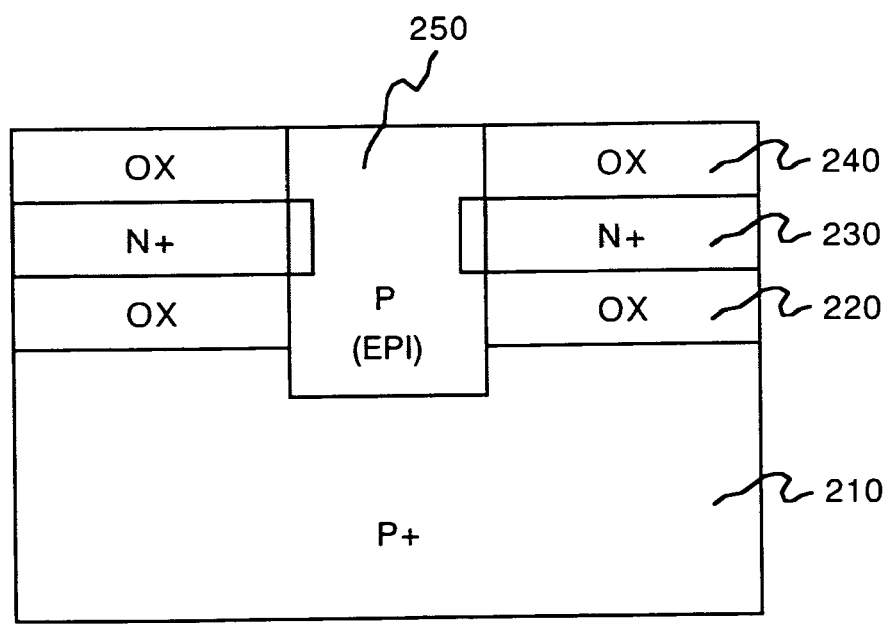
FIG. 2 shows a block diagram of a FET, in accordance with another embodiment of the present invention.

Referring to FIGS. 1 and 2, block diagrams of field effect transistors (FET), in accordance with embodiments of the present invention, are shown. As depicted in FIGS. 1 and 2, the FETs include a first semiconductor layer (e.g., substrate) 110, 210, a first dielectric layer 120, 220, a second semiconductor layer 130, 230, a second dielectric layer 140, 240 and a third semiconductor layer 150, 250. The first dielectric layer 120, 220 may be disposed upon the first semiconductor layer 110, 210. The second semiconductor layer 130, 230 may be disposed upon the first dielectric layer 120, 220 opposite the first semiconductor layer 110, 210. The second dielectric layer 140, 240 may be disposed upon the second semiconductor layer 130, 230 opposite the first dielectric layer 120, 220. The third semiconductor layer 150, 250 may be disposed upon the first semiconductor layer 110, 210 between a first and second portion of the first dielectric layer 120, 220, a first and second portion of the second semiconductor layer 130, 230 and a first and second portion of the second dielectric layer 140, 240. The third semiconductor layer 150, 250 may also partially extend into the first semiconductor layer 110, 210. The first semiconductor layer 110, 210 and third semiconductor layer 150, 250 may be of a first conductivity type (e.g., n-doped). The third semiconductor layer 150, 250 may include a moderately doped region and a heavily doped region (not shown). The heavily doped region (e.g., first portion of the third semiconductor layer 150, 250) may be proximate the second dielectric layer 140, 240. The moderately doped region (e.g., second portion of the third semiconductor layer 150, 250) may be proximate the first semiconductor layer 110, 210, the first dielectric layer 120, 220, and the second semiconductor layer 130, 230. The second semiconductor layer 130, 230 may be of a second conductivity type (e.g., p-doped).

The second semiconductor layer 130, 230 comprises a gate of the FET. A first portion of the third semiconductor layer 150, 250, proximate the second dielectric layer 140, 240, comprises a source of the FET. A second portion of the third semiconductor layer 150, 250, proximate the second semiconductor layer 130, 230, comprises a channel of the FET. A third portion of the third semiconductor layer 150, 250, proximate the first dielectric layer 120, 220 and the first semiconductor layer 110, 210, comprises a drain of the FET.

It is appreciated that the first semiconductor layer 110, 210 may be the source of the FET and the first portion of the third semiconductor layer 150, 250 proximate the second dielectric layer (e.g., opposite the substrate) may be the drain of the FET. However, so as not to unnecessarily obscure aspects of the present invention, embodiments of the present invention will be described herein where the first semiconductor layer 110, 210 is the drain of the FET and the portion of the third semiconductor layer 150, 250, opposite the first semiconductor layer 110, 210, is the source.

In an n-channel implementation, as depicted in FIG. 1, the first semiconductor layer 110 may be silicon, gallium arsenide, indium phosphide or the like, heavily n-doped with Phosphorus, Arsenic or the like. The second semiconductor layer 120 may be polysilicon heavily p-doped with Boron or the like. The third semiconductor layer 150 may be silicon, gallium arsenide, indium phosphide, or the like, moderately n-doped with Phosphorus, Arsenic, or the like. The first and second dielectric layers 120, 140 may be silicon dioxide, oxide-nitride-oxide (ONO), spin-on glass (SOG), flowable oxide, a high-dielectric-constant material (e.g., BST, PZT, etc.) and/or the like.

In a depletion mode implementation, the relative doping concentrations of the second semiconductor layer 130 and the third semiconductor layer 150 may be such that a space charge region formed there between, in an equilibrium state, extends partially across the third semiconductor layer 150 proximate the second semiconductor layer 130. Hence, in the equilibrium state, a conductive channel is present between the source and drain. When the gate-to-channel junction is forward-biased, an "on-state" current can flow. The on-state current flows substantially through the third semiconductor layer 150 between the source and drain. When the gate-to-channel junction is reverse-biased, the width of the space charge region increases. Therefore, if the gate-to-channel junction is sufficiently reverse-biased the space charge region will occupy the entire conductive channel and substantially no current flows through the third semiconductor layer 150.

In an enhancement mode implementation, the relative doping concentrations of the second semiconductor layer 130 and the third semiconductor layer 150 may be such that a space charge region formed there between, in an equilibrium state, extends across the third semiconductor layer 150 proximate the second semiconductor layer 130. Hence, in the equilibrium state, a conductive channel is not present between the source and drain. When the gate-to-channel junction is sufficiently forward-biased a conduction channel is induced and an "on-state" current can flow. The on-state current flows substantially through the third semiconductor layer 150 between the source and drain. When the gate-to-channel junction is reverse-biased substantially no current flows through the third semiconductor layer 150.

In another embodiment, as depicted in FIG. 2, the first semiconductor layer 210 may be silicon, gallium arsenide, indium phosphide or the like, heavily p-doped with Boron or the like. The second semiconductor layer 230 may be polysilicon heavily n-doped with Phosphorus, Arsenic or the like. The third semiconductor layer 250 may be silicon, gallium arsenide, indium phosphide or the like, moderately p-doped with Boron or the like. The first and second dielectric layers 220, 240 may be silicon dioxide, oxide-nitride-oxide (ONO), spun on glass, flowable oxide, a high-dielectric-constant material (e.g., BST, PZT, etc.) and/or the like.

In a depletion mode implementation, the relative doping concentrations of the second semiconductor layer 230 and the third semiconductor layer 250 may be such that a space charge region formed there between, in an equilibrium state, extends across the third semiconductor layer 250 proximate the second semiconductor layer 230. Hence, in the equilibrium state, a conductive channel is not present between the source and drain. When the gate-to-channel junction is sufficiently forward-biased a conduction channel is induced and an "on-state" current can flow. The on-state current flows substantially through the third semiconductor layer 250 between the source and drain. When the gate-to-channel junction is reverse-biased substantially no current flows through the third semiconductor layer 250.

In an enhancement mode implementation, the relative doping concentrations of the second semiconductor layer 230 and the third semiconductor layer 250 may be such that a space charge region formed there between, in an equilibrium state, extends partially across the third semiconductor layer 250 proximate the second semiconductor layer 230. Hence, in the equilibrium state, a conductive channel is present between the source and drain. When the gate-to-channel junction is forward-biased, an "on-state" current can flow. The on-state current flows substantially through the third semiconductor layer 250 between the source and drain. When the gate-to-channel junction is reverse-biased, the width of the space charge region increases. Therefore, if the gate-to-channel junction is sufficiently reverse-biased the space charge region will occupy the entire conductive channel and substantially no current flows through the third semiconductor layer 250.

Although the above embodiments of the present invention are described with reference to a single FET, it is appreciated that above-described embodiments may be readily modified to form devices including a plurality of FETs arranged in a stripe cell, hexagonal cell, mess cell or the like configuration.

It is appreciated that the space charge region of the FETs, in accordance with embodiments of the present invention, is substantially reduced, as compared conventional JFET devices, because the channel length of the device may be substantially reduced. The channel length of the device may be substantially reduced because it is a function of the second semiconductor layer thickness. The thickness of the second semiconductor layer may accurately be controlled to produce thin films having thicknesses of tens of nanometers or less by controlling the time period of the chemical vapor deposition process utilized to deposit the thin films. In conventional JFET devices, the channel length of the device is defined by a photolithography process, which has substantially reached a limit due to the minimum wavelength of light used to activate the photo resist. Hence, the FETs exhibit a very low gate capacitance (e.g., $C_{GS}$, $C_{GD}$). The FETs also exhibit a high p-n junction built-in potential, which may reduce or eliminate the need for a breakdown voltage protection PN diode. Accordingly, the FETs may advantageously be utilized in applications requiring high switching rates, such as VRM servers and RF components.

Figure 3:
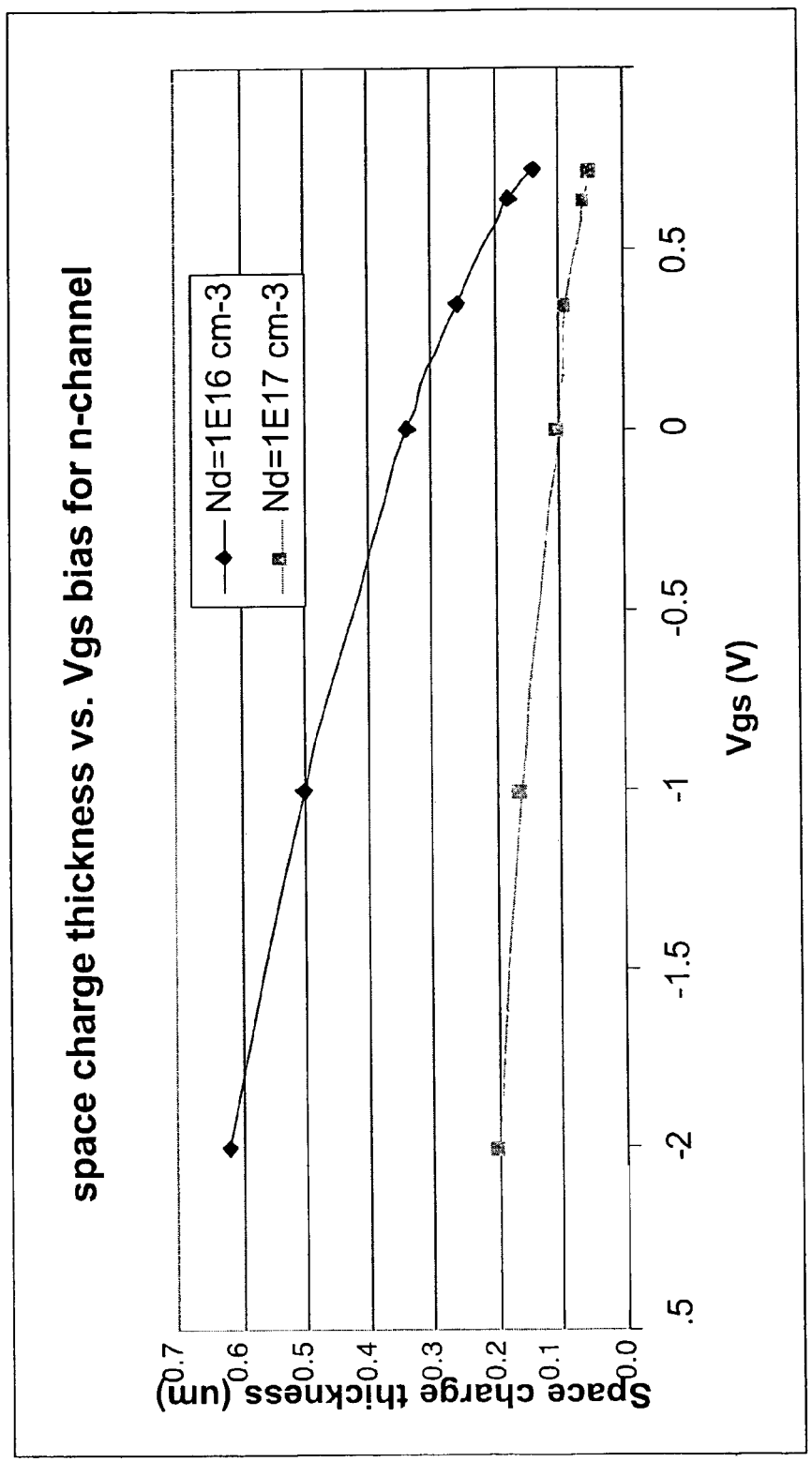
FIG. 3 shows a graph of space charge thickness versus gate-to-source voltage ($V_{GS}$) for a FET, in accordance with an exemplary embodiment of the present invention.

Referring now to FIG. 3, a graph of space charge thickness versus gate-to-source voltage ($V_{GS}$) for a FET, in accordance with an exemplary embodiment of the present invention, is shown. As depicted in FIG. 3, the space charge thickness versus gate-to-source voltage ($V_{GS}$) is plotted for: a gate doping level of $1.0E19$ cm$^{-3}$ and a channel doping of $1.0E16$ cm$^{-3}$; and a gate doping level of $1.0E19$ cm$^{-3}$ and a channel doping of $1.0E17$ cm$^{-3}$. It is appreciated that the space charge thickness increases for an increase in the gate-to-source voltage ($V_{GS}$). The space charge thickness may be utilized to extrapolate the width of the channel region (e.g., third semiconductor layer) in accordance with embodiments of the present invention.

Figure 4:
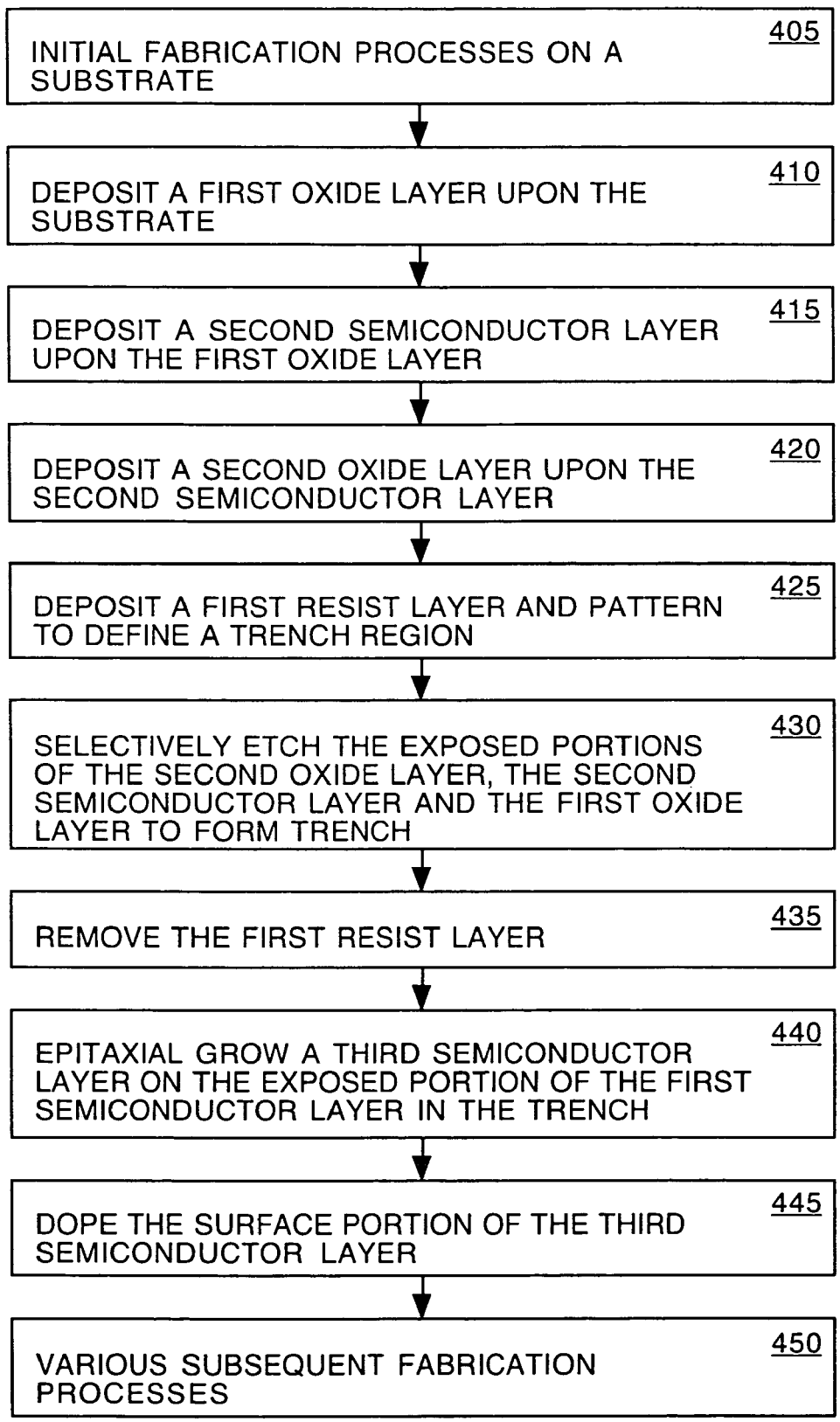
FIG. 4 shows a flow diagram of steps in a method of fabricating a field effect transistor (FET), in accordance with one embodiment of the present invention.

Referring now to FIG. 4, a flow diagram of a method of fabricating a field effect transistor (FET), in accordance with one embodiment of the present invention, is shown. As depicted in FIG. 4, the method may begin, at 405, with various initial processes upon a semiconductor substrate (e.g., a first semiconductor layer). The various initial processes may include cleaning, depositing, etching and/or the like. The semiconductor substrate may contain a first type of dopant at a first concentration. In an n-channel implementation, the substrate may be silicon, gallium arsenide, indium phosphide or the like, heavily doped with Phosphorus or Arsenic (N+) at a concentration of approximately $1.0E17$ cm$^{-3}$ to $1.0E20$ cm$^{-3}$. In a p-channel implementation, the substrate may be silicon, gallium arsenide, indium phosphide or the like, heavily doped with Boron (P+).

At 410, a first dielectric layer may be deposited upon the substrate. In one implementation, the first dielectric layer may be approximately 15 nm to 3 μm thick. In one implementation, the first dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the first dielectric layer may be formed by any well known thermal oxidation process. In yet another implementation, the first dielectric layer may be formed by a thermal oxidation process followed by a deposition process.

At 415, a second semiconductor layer may be deposited upon the first dielectric layer. In one implementation, the second semiconductor layer may be a polysilicon layer approximately 15 nm to 1 μm. The polysilicon layer may be deposited by chemical vapor deposition (CVD) or the like process. In an n-channel implementation, the polysilicon layer may be heavily doped with Boron (P+) at a concentration of approximately $5.0E16$ cm$^{-3}$ to $1.0E20$ cm$^{-3}$. In a p-channel implementation, the polysilicon layer may be heavily doped with Phosphorus or Arsenic (N+). The doping may be performed in-situ during the deposition process or in a separate well known in the art implanting process.

The channel length (Lg) of the device will be substantially equal to the thickness of the deposited second semiconductor region. It is appreciated that thin films deposition processes may be accurately controlled such that the thickness of resulting semiconductor layers may be less than feature sizes obtainable from photolithography processes. Accordingly, the present method may be utilized to form FETs having shorter channel lengths than methods wherein the channel length is controlled by a photolithography process.

At 420, a second dielectric layer may be deposited upon the second semiconductor layer. In one implementation, the second dielectric layer may be approximately 15 nm to 3 μm thick. In one implementation, the second dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the second dielectric layer may be formed by any well known thermal oxidation process. In yet another implementation, the second dielectric layer may also be formed by a thermal oxidation process followed by a deposition process.

At 425, a first photo-resist may be deposited upon the third dielectric layer and patterned by any well known photolithography process to form a first resist layer. In one implementation, the first resist layer defines a trench region. In another implementation, the first resist layer defines a plurality of substantially parallel linear trenches. In yet another implementation, the first resist layer defines a plurality of trenches bounding a plurality of closed cells (e.g., mess, hexagonal, etc.). At 430, the portions of the second dielectric layer, the second semiconductor layer and the first dielectric layer exposed by the first resist layer may be removed by any-well known etching process. In one implementation, the trench may extend to the surface of the first semiconductor layer proximate the first dielectric layer. In another implementation, a portion of the substrate may also be etched, such that the resulting trench extends partially into the substrate. At 435, the first resist layer may be removed utilizing an appropriate resist stripper or resist ashing process.

At 440, a third semiconductor layer may be formed in the trenches. In one implementation, the third semiconductor layer may be an epitaxial grown semiconductor. The third semiconductor layer may be selectively grown, utilizing a chemical vapor deposition or molecular beam epitaxy process, upon the exposed portions of the substrate. The epitaxial grown third semiconductor layer may be silicon, or a material having higher mobility, such gallium arsenide, indium phosphide or the like.

The third semiconductor layer may be doped by introducing the dopant into the epitaxial chamber during deposition. The third semiconductor layer may also be doped by any well known implant process after epitaxial deposition. In an n-channel implementation, the third semiconductor layer may be moderately doped with Phosphorus or Arsenic (N) at a concentration of approximately $1.0E16$ $cm^{-3}$ to $1.0E17$ $cm^{-3}$. In a p-channel implementation, the third semiconductor layer may be moderately doped with Boron (P). It is appreciated that impurities in the heavily doped second semiconductor layer may diffuse into the third semiconductor layer as it is epitaxially grown. Accordingly, the gate may partially extend into the channel of the resulting FET, as depicted in FIGS. 1 and 2.

It is appreciated that the third semiconductor and first semiconductor materials may be selected to generate a strained third semiconductor layer. For example, the first semiconductor material may be a silicon substrate and the third semiconductor layer may be epitaxial deposited silicon germanium, the first semiconductor material may be a gallium arsenide substrate and the third semiconductor layer may be gallium indium arsenide, or the like combinations.

Referring again to FIG. 4, at optional operation 445, a portion of the third semiconductor layer proximate the second dielectric layer may be heavily doped. In one implementation, the surface portion of the third semiconductor layer may be doped utilizing any well known implant process. In another implementation, the surface portion of the third semiconductor layer may be heavily doped by increasing the impurity concentration during the epitaxial deposition at step 435. In an n-channel implementation, the surface portion of the third semiconductor layer may be heavily doped with Phosphorus or Arsenic (N+) at a concentration of approximately $1.0E17$ $cm^{-3}$ to $1.0E20$ $cm^{-3}$. In a p-channel implementation, the surface portion of the third semiconductor layer may be heavily doped with Boron (P+). At 450, the method continues with various other processes. The various other processes typically include passivation, etching, doping, metalization, cleaving and/or the like.

It is appreciated that the breakdown voltage of the FETs, in accordance with embodiments of the present invention, is a function of the thickness of the dielectric layers and the doping of the gate material (e.g., third semiconductor layer). It is also appreciated that the FETS may advantageously be formed in silicon-on-insulator substrates.

Figure 5:
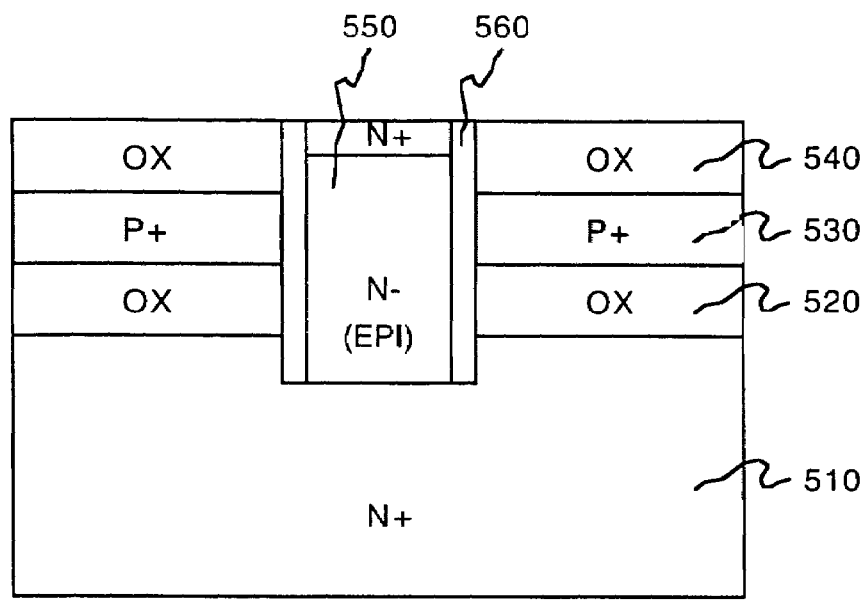
FIG. 5 shows a sectional view block diagram of a FET, in accordance with another embodiment of the present invention.
Figure 6:
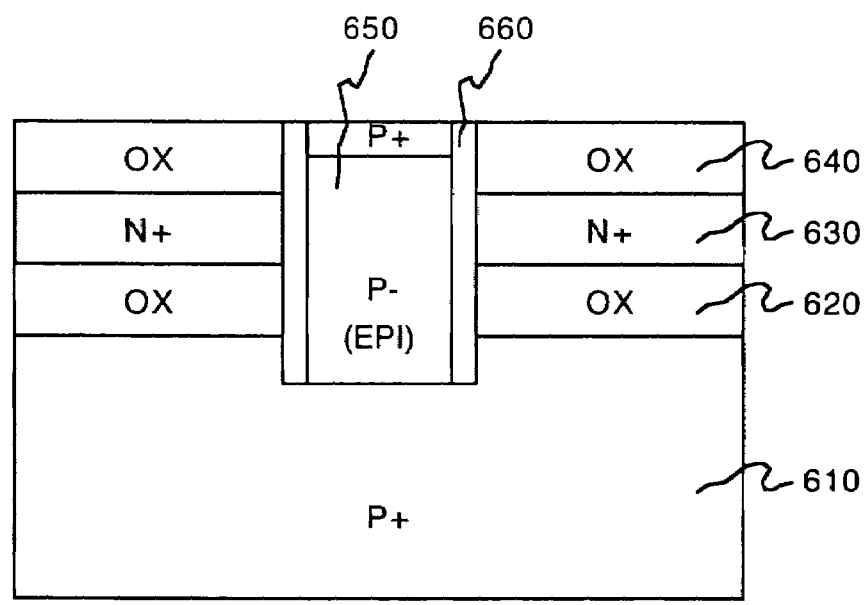
FIG. 6 shows a sectional view block diagram of a FET, in accordance with another embodiment of the present invention.

Referring now to FIGS. 5 and 6, block diagrams of field effect transistors (FET), in accordance with embodiments of the present invention, are shown. As depicted in FIGS. 5 and 6, the FETs includes a first semiconductor layer (e.g., substrate) 510, 610, a first dielectric layer 520, 620, a second semiconductor layer 530, 630, a second dielectric layer 540, 640, a third semiconductor layer 550, 650 and a third dielectric layer 560, 660. The first dielectric layer 520, 620 may be disposed upon the first semiconductor layer 510, 610. The second semiconductor layer 530, 630 may be disposed upon the first dielectric layer 520, 620 opposite the first semiconductor layer 510, 610. The second dielectric layer 540, 640 may be disposed upon the second semiconductor layer 530, 630 opposite the first dielectric layer 520, 620. The third semiconductor layer 550, 650 may be disposed upon the first semiconductor layer 510, 610 between a first and second portion of the first dielectric layer 520, 620, a first and second portion of the second semiconductor layer 530, 630 and a first and second portion of the second dielectric layer 540, 640. The third semiconductor layer 550, 650 may also partially extend into the first semiconductor layer 510, 610. The first semiconductor layer 510, 610 and third semiconductor layer 550, 650 may be of a first conductivity type (e.g., n-doped). The third semiconductor layer 550, 650 may include a moderately doped region and a heavily doped region. The heavily doped region (e.g., first portion of the third semiconductor layer 550, 650) may be proximate the second dielectric layer 540, 640. The moderately doped region (e.g., second portion of the third semiconductor layer 550, 650) may be proximate the first semiconductor layer 510, 610, the first dielectric layer 520, 620, and the second semiconductor layer 530, 630. The second semiconductor layer 530, 630 may be of a second conductivity type (e.g., p-doped).

A first portion of the third dielectric layer 560, 660 may be disposed between the third semiconductor layer 550, 650 and the first portion of the first dielectric layer 520, 620, the first portion of the second semiconductor layer 530, 630 and the first portion of the second dielectric layer. A second portion of the third dielectric layer 560, 660 may be disposed between the third semiconductor layer 550, 650 and the second portion of the first dielectric layer 520, 620, the second portion of the second semiconductor layer 530, 630 and the second portion of the second dielectric layer 540, 640. The third dielectric layer 560, 660 may also be partially disposed between portions of the third semiconductor layer 550, 650 and portions of the first semiconductor layer 510, 610.

The second semiconductor layer 530, 630 may be the gate of the FET. A first portion of the third semiconductor layer 550, 650, proximate the second dielectric layer 540, 640, may be the source of the FET. A second portion of the third semiconductor layer 550, 650, proximate the second semiconductor layer 530, 630, may be the channel of the FET. A third portion of the third semiconductor layer 550, 650, proximate the first dielectric layer 520, 620, and the first semiconductor layer 510, 610 may be the drain of the FET. The third dielectric layer 560, 660 may constitute a gate oxide of the FET. It is also appreciated that the first semiconductor layer 510, 610 may be the source of the FET and the first portion of the third semiconductor layer 550, 650, proximate the second dielectric layer 540, 640 (e.g., opposite the substrate) may be the drain of the FET.

In an n-channel implementation, as depicted in FIG. 5, the first semiconductor layer 510 may be silicon, gallium arsenide, indium phosphide or the like heavily n-doped with Phosphorus, Arsenic or the like. The second semiconductor layer 530 may be polysilicon heavily p-doped with Boron or the like. The channel portion of the third semiconductor layer 550 may be silicon, gallium arsenide, indium phosphide or the like lightly n-doped with Phosphorus, Arsenic or the like. The source portion of the third semiconductor layer 550 may be heavily n-doped with Phosphorus, Arsenic or the like. The first and second dielectric layers 520, 540 may be silicon dioxide, oxide-nitride-oxide (ONO), a spin-on glass (SOG), a flowable oxide, a high-dielectric-constant material (e.g., BST, PZT, etc.) and/or the like. The third dielectric layer 560 may be silicon dioxide, a high-dielectric-constant material (e.g., BST, PZT, etc.) or the like.

When a negative potential is applied to the gate (e.g., second semiconductor layer) a depletion region is induced in the channel (e.g., third semiconductor layer) proximate the gate. The depletion region may pinch-off the channel when the gate voltage is reduced below a threshold voltage. Accordingly, substantially no current flows through the channel (e.g., third semiconductor layer). However, current can flow through the channel when the gate potential is greater than the threshold voltage.

In a p-channel implementation, as depicted in FIG. 6, the first semiconductor layer 610 may be silicon, gallium arsenide, indium phosphide or the like heavily p-doped with Boron or the like. The second semiconductor layer 630 may be polysilicon heavily n-doped with Phosphorus, Arsenic or the like. Alternatively, a metal layer, of aluminum, tungsten or the like, may be substituted for the second semiconductor layer. The channel portion of the third semiconductor layer 650 may be silicon, gallium arsenide, indium phosphide or the like lightly p-doped with Boron or the like. The source portion of the third semiconductor layer 650 may be heavily p-doped with Boron or the like. The first and second dielectric layers 620, 640 may be silicon dioxide, oxide-nitride-oxide (ONO), a spin-on glass (SOG), a flowable oxide, a high-dielectric-constant material (e.g., BST, PZT, etc.) and/or the like. The third dielectric layer 660 may be silicon dioxide, a high-dielectric-constant material (e.g., BST, PZT, etc.) or the like.

When a positive potential is applied to the gate (e.g., second semiconductor layer) a depletion region is induced in the channel (e.g., third semiconductor layer) proximate the gate. The depletion region may pinch-off the channel when the gate voltage exceeds a threshold voltage. Accordingly, substantially no current flows through the channel (e.g., third semiconductor layer). However, current can flow through the channel when the gate potential is less than the threshold voltage.

Although the above embodiments of the present invention are described with reference to a single FET, it is appreciated that above-described embodiments may be readily modified to form devices including a plurality of FETs arranged in a stripe cell, hexagonal cell, mess cell or the like configuration.

Figure 7:
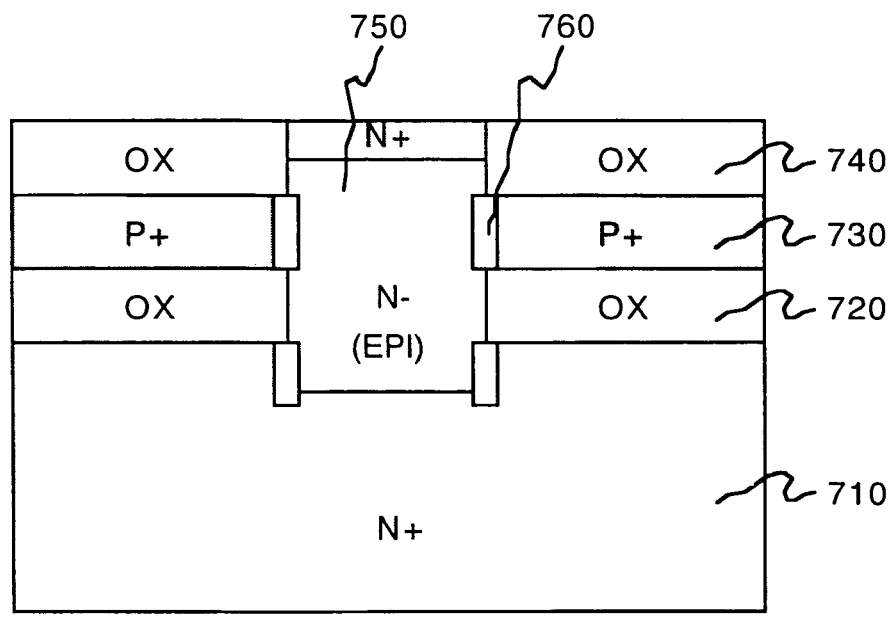
FIG. 7 shows a sectional view block diagram of a FET, in accordance with another embodiment of the present invention.
Figure 8:
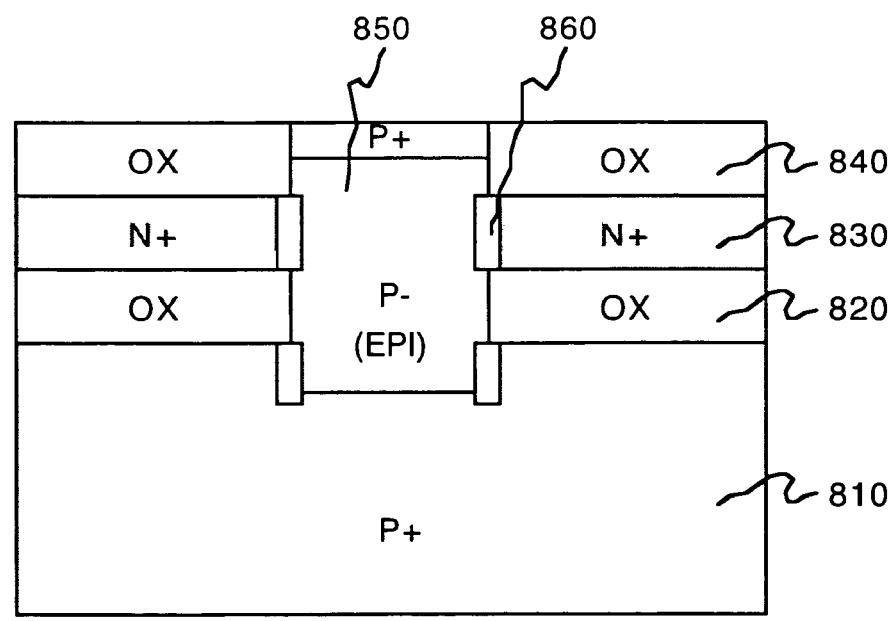
FIG. 8 shows a block diagram of a FET, in accordance with another embodiment of the present invention.

Referring now to FIGS. 7 and 8, block diagrams of field effect transistors (FET), in accordance with embodiments of the present invention, are shown. As depicted in FIGS. 7 and 8, the FETs includes a first semiconductor layer 710, 810 (e.g., substrate), a first dielectric layer 720, 820, a second semiconductor layer 730, 830, a second dielectric layer 740, 840, a third semiconductor layer 750, 850 and a third dielectric layer 760, 860. The first dielectric layer 720, 820 may be disposed upon the first semiconductor layer 710, 810. The second semiconductor layer 730, 830 may be disposed upon the first dielectric layer 720, 820 opposite the first semiconductor layer 710, 810. The second dielectric layer 740, 840 may be disposed upon the second semiconductor layer 730, 830 opposite the first dielectric layer 720, 820. The third semiconductor layer 750, 850 may be disposed upon the first semiconductor layer 710, 810 between a first and second portion of the first dielectric layer 720, 820, a first and second portion of the second semiconductor layer 730, 830 and a first and second portion of the second dielectric layer 740, 840. The third semiconductor layer 750, 850 may also partially extend into the first semiconductor layer 710, 810. The third dielectric layer 760, 860 may be disposed between the third semiconductor layer 750, 850 and the first and second portions of the second semiconductor layer 730, 830. The third dielectric layer 760, 860 may also be partially disposed between the third semiconductor layer 750, 850 and portions of the first semiconductor layer 710, 810. The first semiconductor layer 710, 810 and third semiconductor layer 750, 850 may be of a first conductivity type (e.g., n-doped). The third semiconductor layer 750, 850 may include a moderately doped region and a heavily doped region. The heavily doped region (e.g., first portion of the third semiconductor layer 750, 850) may be proximate the second dielectric layer 740, 840. The moderately doped region (e.g., second portion of the third semiconductor layer 750, 850) may be proximate the first semiconductor layer 710, 810, the first dielectric layer 720, 820, and the second semiconductor layer 730, 830. The second semiconductor layer 730, 830 may be of a second conductivity type (e.g., p-doped).

The second semiconductor layer 730, 830 comprises a gate of the FET. A first portion of the third semiconductor layer 750, 850, proximate the second dielectric layer 740, 840, comprises a source of the FET. A second portion of the third semiconductor layer 750, 850, proximate the second semiconductor layer 730, 830, comprises a channel of the FET. A third portion of the third semiconductor layer 750, 850, proximate the first dielectric layer 720, 820 and the first semiconductor layer 710, 810, comprises a source of the FET. The third dielectric layer 760, 860 comprises a gate oxide of the FET. It is also appreciated that the first semiconductor layer 710, 810 may be the source of the FET and the first portion of the third semiconductor layer 750, 850, proximate the second dielectric layer 740, 840 (e.g., opposite the substrate) may be the drain of the FET.

In an n-channel implementation, as depicted in FIG. 7, the first semiconductor layer 710 may be silicon, gallium arsenide, indium phosphide or the like heavily n-doped with Phosphorus, Arsenic or the like. The second semiconductor layer 730 may be polysilicon heavily p-doped with Boron or the like. The channel portion of the third semiconductor layer 750 may be silicon, gallium arsenide, indium phosphide or the like lightly n-doped with Phosphorus, Arsenic or the like. The source portion of the third semiconductor layer 750 may be heavily n-doped with Phosphorus, Arsenic or the like. The first and second dielectric layers 720, 740 may be silicon dioxide, oxide-nitride-oxide (ONO), a spin-on glass (SOG), a flowable oxide, a high-dielectric-constant material (e.g., BST, PZT, etc.) and/or the like. The third dielectric layer 760 may be silicon dioxide.

When a negative potential is applied to the gate (e.g., second semiconductor layer) a depletion region is induced in the channel (e.g., third semiconductor layer) proximate the gate. The depletion region may pinch-off the channel when the gate voltage is reduced below a threshold voltage. Accordingly, substantially no current flows through the channel (e.g., third semiconductor layer). However, current can flow through the channel when the gate potential is greater than the threshold voltage.

In a p-channel implementation, as depicted in FIG. 8, the first semiconductor layer 810 may be silicon, gallium arsenide, indium phosphide or the like heavily p-doped with Boron or the like. The second semiconductor layer 830 may be polysilicon heavily n-doped with Phosphorus, Arsenic or the like. The channel portion of the third semiconductor layer 850 may be silicon, gallium arsenide, indium phosphate or the like lightly p-doped with Boron or the like. The source portion of the third semiconductor layer 850 may be heavily p-doped with Boron or the like. The first and second dielectric layers 820, 840 may be silicon dioxide, oxide-nitride-oxide (ONO), a spin-on glass (SOG), a flowable oxide, a high-dielectric-constant material (e.g., BST, PZT, etc.) and/or the like. The third dielectric layer 860 may be silicon dioxide.

When a positive potential is applied to the gate (e.g., second semiconductor layer) a depletion region is induced in the channel (e.g., third semiconductor layer) proximate the gate. The depletion region may pinch-off the channel when the gate voltage exceeds a threshold voltage. Accordingly, substantially no current flows through the channel (e.g., third semiconductor layer). However, current can flow through the channel when the gate potential is less than the threshold voltage.

Although the above embodiments of the present invention are described with reference to a single FET, it is appreciated that above-described embodiments may be readily modified to form devices including a plurality of FETs arranged in a stripe cell, hexagonal cell, mess cell or the like configuration.

Figure 9A:
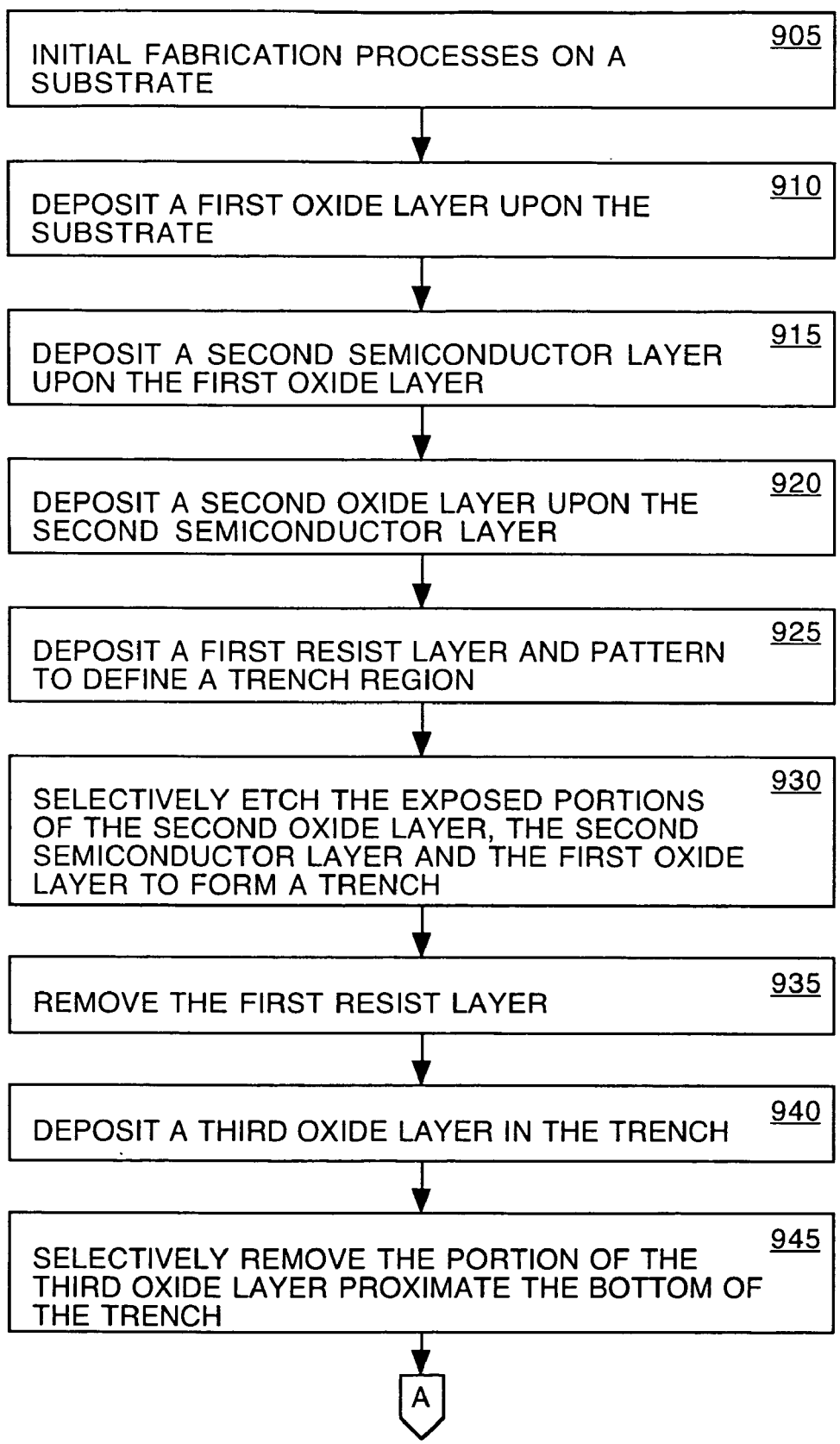
FIGS. 9A and 9B show a flow diagram of steps in a method of fabricating a FET, in accordance with another embodiment of the present invention.
Figure 9B:
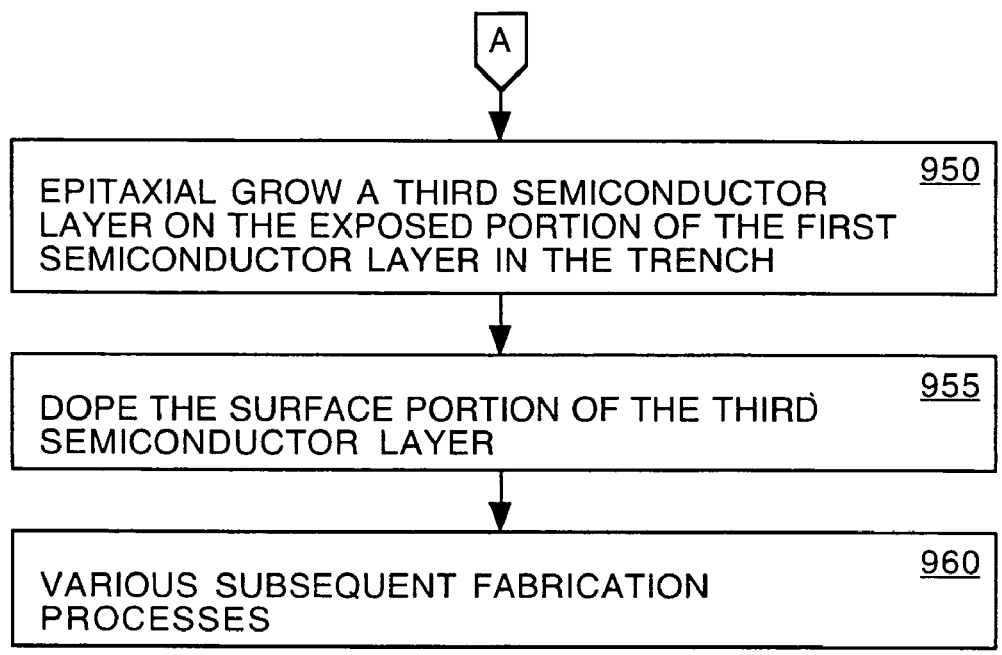

Referring now to FIGS. 9A and 9B, a flow diagram of a method of fabricating a field effect transistor (FET), in accordance with one embodiment of the present invention, is shown. As depicted in FIGS. 9A and 9B, the method may begin, at 905, with various initial processes upon a semiconductor substrate (e.g., a first semiconductor layer). The various initial processes may include cleaning, depositing, etching and/or the like. The semiconductor substrate may include a first type of dopant at a first concentration. In an n-channel implementation, the substrate may be silicon, gallium arsenide, indium phosphide or the like, heavily doped with Phosphorus or Arsenic (N+) at a concentration of approximately $5.0E16$ cm$^{-3}$ to $1.0E20$ cm$^{-3}$. In a p-channel implementation, the substrate may be silicon, gallium arsenide, indium phosphide or the like, heavily doped with Boron (P+).

At 910, a first dielectric layer may be deposited upon the substrate. In one implementation, the first dielectric layer may be approximately 15 nm to 3 μm. In one implementation, the first dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the first dielectric layer may be formed by any well known thermal oxidation process. In yet another implementation, the first dielectric layer may also be formed by a thermal oxidation process followed by a deposition process.

At 915, a second semiconductor layer may be deposited upon the dielectric layer. In one implementation, the second semiconductor layer may be a polysilicon layer approximately 15 nm to 1 μm. The polysilicon layer may be deposited by chemical vapor deposition (CVD) or the like process. In an n-channel implementation, the polysilicon layer may be heavily doped with Boron (P+) at a concentration of approximately $5.0E16$ cm$^{-3}$ to $1.0E20$ cm$^{-3}$. In a p-channel implementation, the polysilicon layer may be heavily doped with Phosphorus or Arsenic (N+). The doping may be performed in-situ during the deposition process or in a separate well known in the art implanting process.

At 920, a second dielectric layer may be deposited upon the second semiconductor layer. In one implementation, the second dielectric layer may be approximately 15 nm to 3 μm thick. In one implementation, the second dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the second dielectric layer may be formed by any well known thermal oxidation process. In yet another implementation, the second dielectric layer may also be formed by a thermal oxidation process followed by a deposition process.

At 925, a first photo-resist may be deposited and patterned by any well known photolithography process to form a first resist layer. In one implementation, the first resist layer defines a trench region. In another implementation, the first resist layer defines a plurality of substantially parallel linear trenches. In yet another implementation, the first resist layer defines a plurality of trenches bounding a plurality of closed cells (e.g., mess, hexagonal, etc.). At 930, the portions of the second dielectric layer, the second semiconductor layer and the first dielectric layer exposed by the first resist layer may be removed by any-well known etching process. In one implementation, the trench may extend to the surface of the first semiconductor layer proximate the first dielectric layer. In another implementation, a portion of the substrate may also be etched, such that the resulting trench extends partially into the substrate. At 935, the first resist layer may be removed utilizing an appropriate resist stripper or resist ashing process.

At 940, a third dielectric layer may be formed in the first and second semiconductor layers proximate the trenches. In one implementation, the third dielectric layer may be approximately 15 nm to 200 nm thick. In one embodiment, the third dielectric layer may be formed by any well known deposition process, such as chemical vapor deposition or the like. The deposited third dielectric layer may substantially cover the exposed portions of the first semiconductor layer, the first dielectric layer, the second semiconductor layer and the second dielectric layer as depicted in FIGS. 5 and 6 (e.g., covering the walls and bottom of the trench). In another embodiment, the third dielectric layer may be formed by any well known thermal oxidation process. The grown third dielectric layer may substantially be formed in the exposed portions of the first semiconductor layer and the second semiconductor layer as depicted in FIGS. 7 and 8.

It is appreciated that the third semiconductor and first semiconductor materials may be selected to generate a strained third semiconductor layer. For example, the first semiconductor material may be a silicon substrate and the third semiconductor layer may be epitaxial deposited silicon germanium, the first semiconductor material may be a gallium arsenide substrate and the third semiconductor layer may be gallium indium arsenide, or the like combinations.

At 945, a portion of the third dielectric layer proximate the bottom of the trenches is selectively removed. In one embodiment, the portion of the third dielectric layer proximate the bottom of the trenches may be selectively removed utilizing any well known anisotropic etching process in combination with a spacer. The spacer may protect the third dielectric layer along the walls from the etching process such that only the oxide at the bottom of the trench is etched. In another embodiment, the portion of the third dielectric layer proximate the bottom of the trenches may be selectively removed utilizing any well known anisotropic etching process, such as plasma or reactive-ion etching. It is appreciated that the thermal oxidation of the second semiconductor layer, at 940, results in the third dielectric layer growing approximately half into and half out of the second semiconductor layer. Accordingly, an anisotropic etching process may be utilized to remove the oxide along the trench bottom and the portion of the oxide that grew out from the trench wall, while the portion of the oxide that grew into the second semiconductor layer remains after etching.

At 950, a third semiconductor layer may be formed in the trenches. In one implementation, the third semiconductor layer may be an epitaxial grown semiconductor. The third semiconductor layer may be selectively grown, utilizing a chemical vapor deposition or molecular beam epitaxy process, upon the exposed portions of the substrate. The epitaxial grown third semiconductor layer may be silicon, or a material having higher mobility, such gallium arsenide, indium phosphide or the like. In an n-channel implementation, the third semiconductor layer may be moderately doped with Phosphorus or Arsenic (N), having a concentration of approximately $1.0E16$ cm$^{-3}$ to $1.0E17$ cm$^{-3}$. In a p-channel implementation, the third semiconductor layer may be moderately doped with Boron (P). The doping may be performed in-situ during the deposition process or in a separate implant process.

At 955, a portion of the third semiconductor layer proximate the third dielectric layer may be heavily doped. In one implementation, the portion of the third semiconductor layer proximate the third dielectric layer may be doped utilizing any well known implant process. In another implementation, the portion of the third semiconductor layer may be heavily doped by increasing the impurity concentration during the epitaxial deposition at step 435. In an n-channel implementation, the portion of the third semiconductor layer may be heavily doped with Phosphorus or Arsenic (N+) at a concentration of approximately $1.0E17$ cm$^{-3}$ to $1.0E20$ cm$^{-3}$. In a p-channel implementation, the portion of the third semiconductor layer may be heavily doped with Boron (P+).

At 960, the method continues with various other processes. The various other processes typically include passivation, etching, doping, metalization, cleaving and/or the like. From the above fabrication processes, it is appreciated that the minimum gate length is not determined by the conventional photolithography limitation, but by the gate material deposition thickness. Furthermore, the gate oxide (e.g., third dielectric layer) advantageously reduces the gate leakage current as compared to conventional JFET devices. The dielectric layers also advantageously reduce lateral diffusion.

Figure 10:
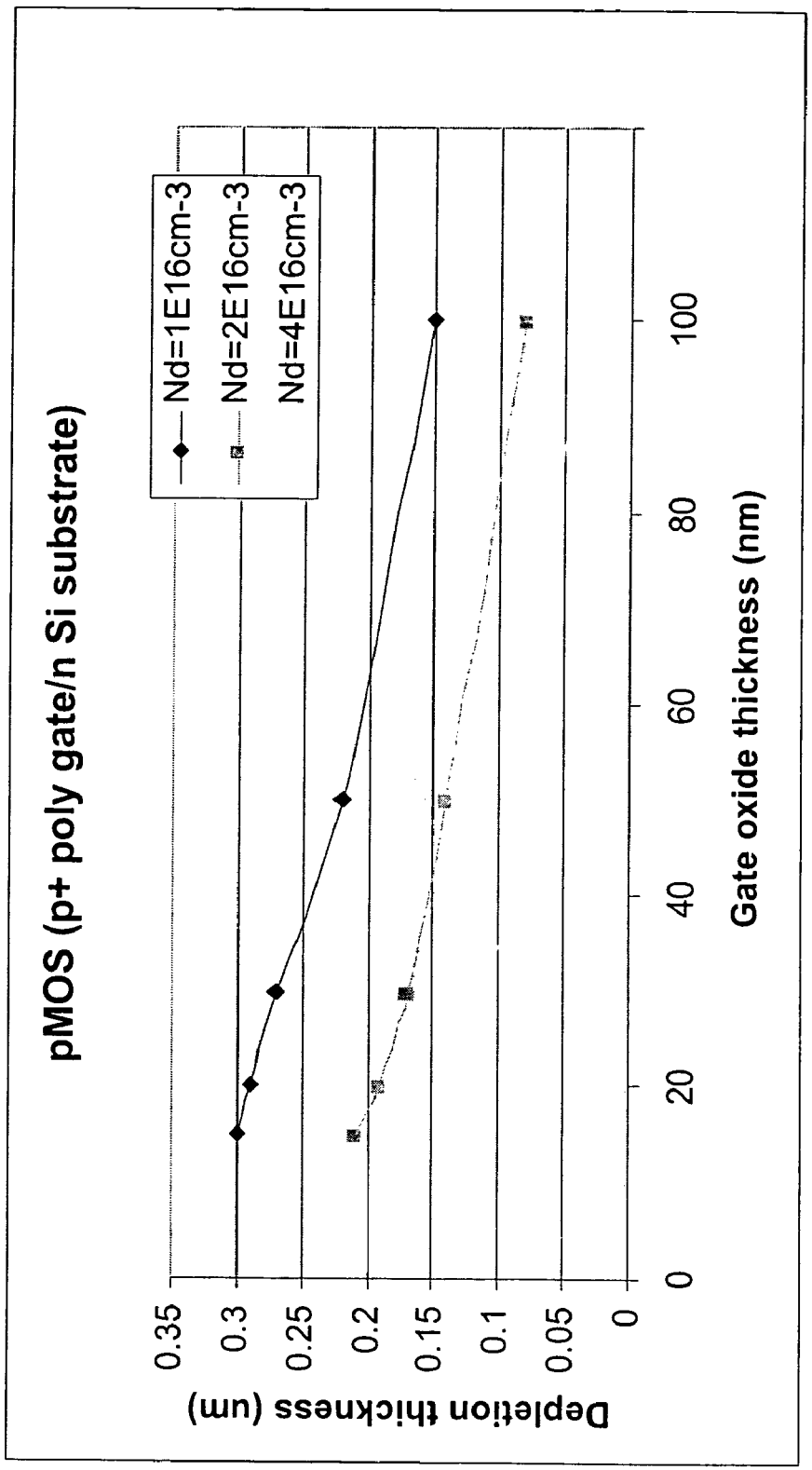
FIG. 10 shows a graph of depletion region (e.g., space charge) thickness versus gate oxide thickness for FETs, in accordance with exemplary n-channel embodiments of the present invention.

Referring now to FIG. 10, a graph of depletion region (e.g., space charge) thickness versus gate oxide thickness for a FET, in accordance with exemplary n-channel embodiments of the present invention, is shown. As depicted in FIG. 10, the depletion region thickness versus gate oxide thickness is plotted for an n-channel FET having: a gate doping level of $1.0E19$ cm$^{-3}$ and a channel doping of $1.0E16$ cm$^{-3}$; a gate doping level of $1.0E19$ cm$^{-3}$ and a channel doping of $2.0E16$ cm$^{-3}$; and a gate doping level of $1.0E19$ cm$^{-3}$ and a channel doping of $4.0E16$ cm$^{-3}$. It is appreciated that the depletion region thickness decreases as the gate oxide thickness increases.

Figure 11:
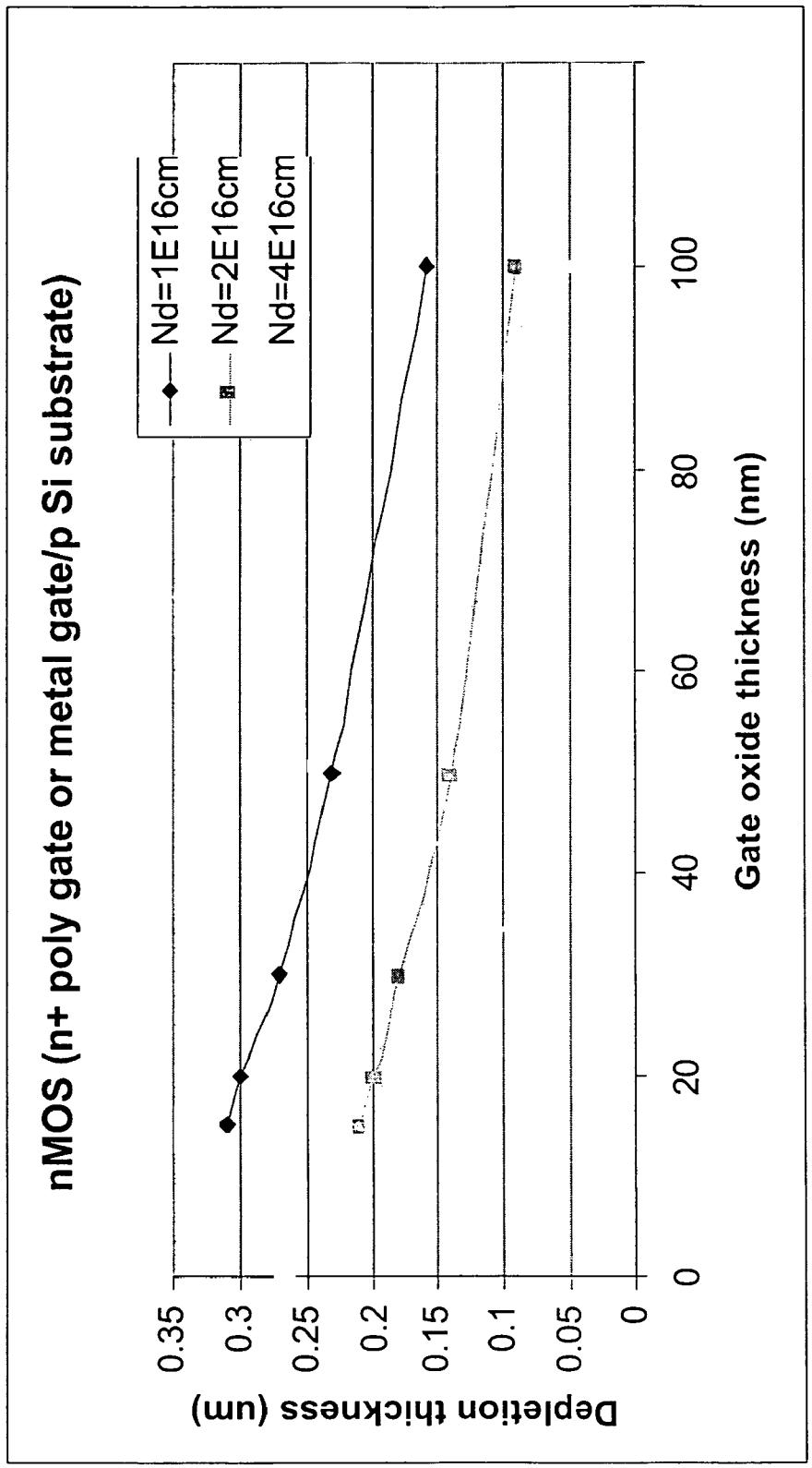
FIG. 11 shows a graph of depletion region (e.g., space charge) thickness versus gate oxide thickness for FETs, in accordance with exemplary p-channel embodiments of the present invention.

Referring now to FIG. 11, a graph of depletion region (e.g., space charge) thickness versus gate oxide thickness for a FET, in accordance with exemplary p-channel embodiments of the present invention, is shown. As depicted in FIG. 11, the depletion region thickness versus gate oxide thickness is plotted for a p-channel FET having: a gate doping level of $1.0E19$ cm$^{-3}$ and a channel doping of $1.0E16$ cm$^{-3}$; a gate doping level of $1.0E19$ cm$^{-3}$ and a channel doping of $2.0E16$ cm$^{-3}$; and a gate doping level of $1.0E19$ cm$^{-3}$ and a channel doping of $4.0E16$ cm$^{-3}$. It is appreciated that the depletion region thickness decreases as the gate oxide thickness increases.

Figure 12:
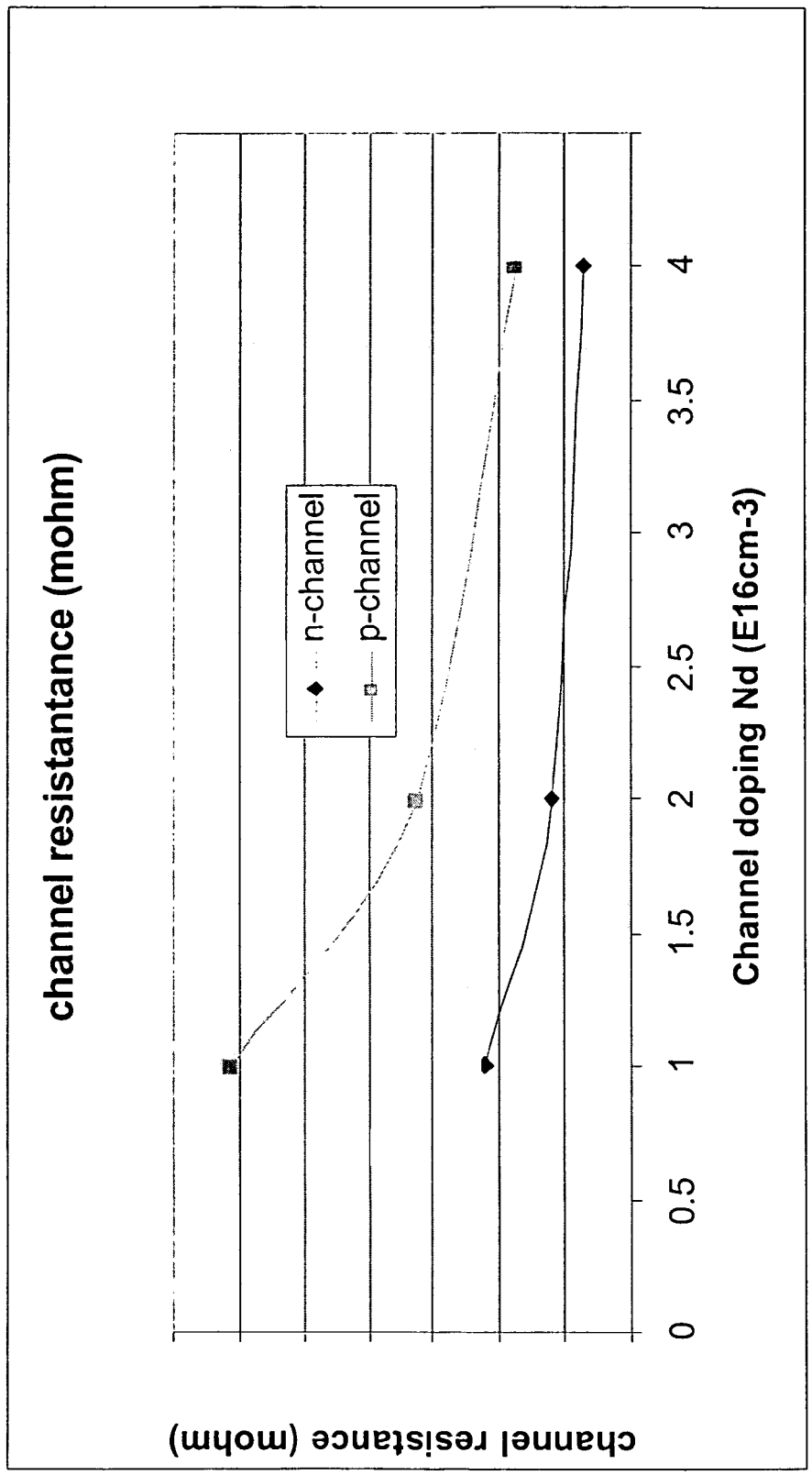
FIG. 12 shows a graph of channel resistance versus channel doping for FETs, in accordance with exemplary embodiments of the present invention.

Referring now to FIG. 12, a graph of channel resistance versus channel doping for a FET, in accordance with exemplary embodiments of the present invention, is shown. As depicted in FIG. 12, the channel resistance versus channel doping level is plotted from an n-channel FET and a p-channel FET. It is appreciated that the channel resistance decreases as the channel doping level increases.

Figure 13:
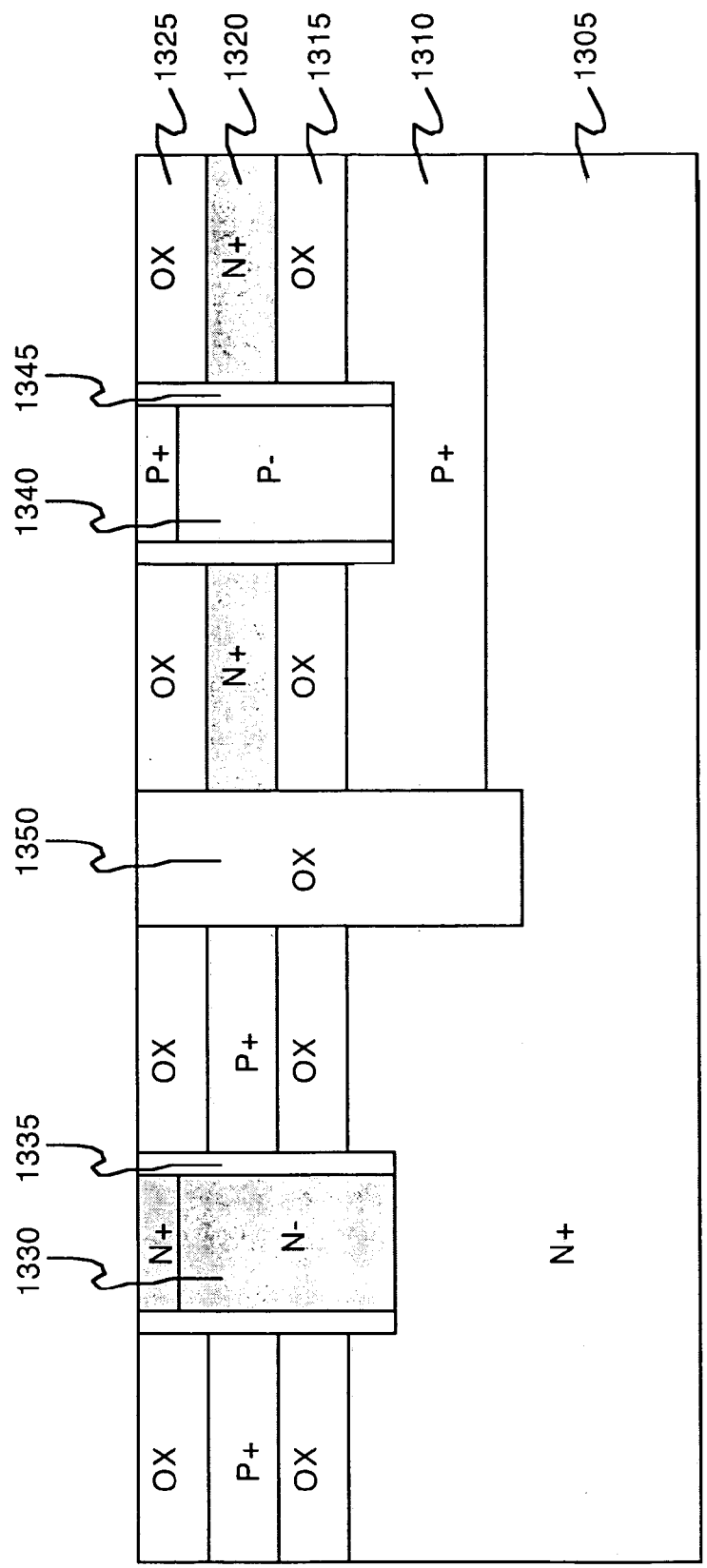
FIG. 13 shows a sectional view block diagram of a complimentary FET, in accordance with one embodiment of the present invention.

Referring now to FIG. 13, a block diagram of complimentary field effect transistors (FET), in accordance with one embodiment of the present invention, is shown. As depicted in FIG. 13, the FETs includes a first semiconductor layer 1305, 1310 (e.g., substrate) having a first doped region 1305 and a second doped region (e.g., a well) 1310, a first dielectric layer 1315, a second semiconductor layer 1320, a second dielectric layer 1325, a third semiconductor layer 1330, a third dielectric layer 1335, a fourth semiconductor layer 1340, a fourth dielectric layer 1345 and a shallow trench isolation region 1350. The first dielectric layer 1315 may be disposed upon the first semiconductor layer 1305, 1310. The second semiconductor layer 1320 may be disposed upon the first dielectric layer 1315 opposite the first semiconductor layer 1305, 1310. The second dielectric layer 1325 may be disposed upon the second semiconductor layer 1320 opposite the first dielectric layer 1315.

The third semiconductor layer 1330 may be disposed upon the first doped region of the first semiconductor layer 1305 between a first and second portion of the first dielectric layer 1315, a first and second portion of the second semiconductor layer 1320 and a first and second portion of the second dielectric layer 1325. The third semiconductor layer 1330 may also partially extend into the first doped region of the first semiconductor layer 1305. A first portion of the third dielectric layer 1335 may be disposed between the third semiconductor layer 1330 and the first portion of the first dielectric layer 1315, the first portion of the second semiconductor layer 1320 and the first portion of the second dielectric layer 1325. A second portion of the third dielectric layer 1335 may be disposed between the third semiconductor layer 1330 and the second portion of the first dielectric layer 1315, the second portion of the second semiconductor layer 1320 and the second portion of the second dielectric layer 1325. The third dielectric layer 1335 may also be partially disposed between portions of the third semiconductor layer 1330 and portions of the first semiconductor layer 1305. The first doped region of the first semiconductor layer 1305 and third semiconductor layer 1330 may be of a first conductivity type (e.g., n-doped). The third semiconductor layer 1330 may include a moderately doped region and a heavily doped region. The heavily doped region may be proximate the first and second portions of the second dielectric layer 1315. The moderately doped region may be proximate the first doped region of the first semiconductor layer 1305, the first and second portions of the first dielectric layer 1315, and the first and second portions of the second semiconductor layer 1320. The first and second portions of the second semiconductor layer 1320 may be of a second conductivity type (e.g., p-doped).

The fourth semiconductor layer 1340 may be disposed upon the second doped region of the first semiconductor layer 1310 between a third and fourth portion of the first dielectric layer 1315, a third and fourth portion of the second semiconductor layer 1320 and a third and fourth portion of the second dielectric layer 1325. The fourth semiconductor layer 1340 may also partially extend into the second doped portion of the first semiconductor layer 1310. A first portion of the fourth dielectric layer 1345 may disposed between the fourth semiconductor layer 1340 and the third portion of the first dielectric layer 1315, the third portion of the second semiconductor layer 1320 and the third portion of the second dielectric layer 1325. A second portion of the fourth dielectric layer 1345 may be disposed between the fourth semiconductor layer 1340 and the fourth portion of the first dielectric layer 1315, the fourth portion of the second semiconductor layer 1320 and the fourth portion of the second dielectric layer 1325. The fourth dielectric layer 1345 may also be partially disposed between portions of the fourth semiconductor layer 1340 and portions of the second doped region of the first semiconductor layer 1310. The second doped region of the first semiconductor layer 1310 and fourth semiconductor layer 1340 may be of the second conductivity type (e.g., p-doped). The fourth semiconductor layer 1340 may include a moderately doped region and a heavily doped region. The heavily doped region may be proximate the third and fourth portions of the second dielectric layer 1325. The moderately doped region may be proximate the second doped region of the first semiconductor layer 1310, the third and fourth portions of the first dielectric layer 1315 and the third and fourth portions of the second semiconductor layer 1320. The third and fourth portions of the second semiconductor layer 1320 may be of the first conductivity type (e.g., n-doped). The shallow trench isolation region 1350 may be disposed between the second and third portions of the first dielectric layer 1315, the second and third portions of the second semiconductor layer 1320 and the second and third portions of the second dielectric layer 1325.

The first and second portions of the second semiconductor layer 1320 comprise the gate of a first FET. A first portion of the third semiconductor layer 1330, proximate the second dielectric layer 1325, may comprise the source of the first FET. A second portion of the third semiconductor layer 1330, proximate the second semiconductor layer 1320, comprises the channel of the first FET. A third portion of the third semiconductor layer 1330, proximate the first dielectric layer 1315, and the first doped region of the first semiconductor layer 1305 may comprise the drain of the first FET. The third dielectric layer 1335 comprises a gate oxide of the first FET.

The third and fourth portions of the second semiconductor layer 1320 comprise the gate of a second FET. A first portion of the fourth semiconductor layer 1340, proximate the second dielectric layer 1325, may comprise the source of the second FET. A second portion of the fourth semiconductor layer 1340, proximate the second semiconductor layer 1320, comprises the channel of the second FET. A third portion of the fourth semiconductor layer 1340, proximate the first dielectric layer 1315, and the second doped region of the first semiconductor layer 1310 may comprise the drain of the second FET. The fourth dielectric layer 1345 comprises a gate oxide of the second FET.

The first doped region of the first semiconductor layer 1305 may be silicon, gallium arsenide, indium phosphide or the like heavily n-doped with Phosphorus, Arsenic or the like. The second doped region of the first semiconductor layer 1310 may be heavily p-doped with Boron or the like. The first and second portions of the second semiconductor layer 1320 may be polysilicon heavily p-doped with Boron or the like. The third and fourth portions of the second semiconductor layer 1320 may be heavily n-doped with Phosphorus, Arsenic or the like. The first and second dielectric layers 1315, 1325 may be silicon dioxide, oxide-nitride-oxide (ONO), a spin-on glass (SOG), a flowable oxide, a high-dielectric-constant material (e.g., BST, PZT, etc.) and/or the like. The third and fourth dielectric layers 1335, 1345 may be silicon dioxide, a high-dielectric-constant material (e.g., BST, PZT, etc.) or the like. The shallow trench isolation region 1350 may be silicon dioxide, oxide-nitride-oxide (ONO), a spin-on glass (SOG), a flowable oxide or the like. The channel portion of the third semiconductor layer 1330 may be silicon, gallium arsenide, indium phosphide or the like lightly n-doped with Phosphorus, Arsenic or the like. The source portion of the third semiconductor layer 1330 may be heavily n-doped with Phosphorus, Arsenic or the like. The channel portion of the fourth semiconductor layer 1340 may be silicon, gallium arsenide, indium phosphate or the like lightly p-doped with Boron or the like. The source portion of the fourth semiconductor layer 1340 may be heavily p-doped with Boron or the like.

Figure 14A:
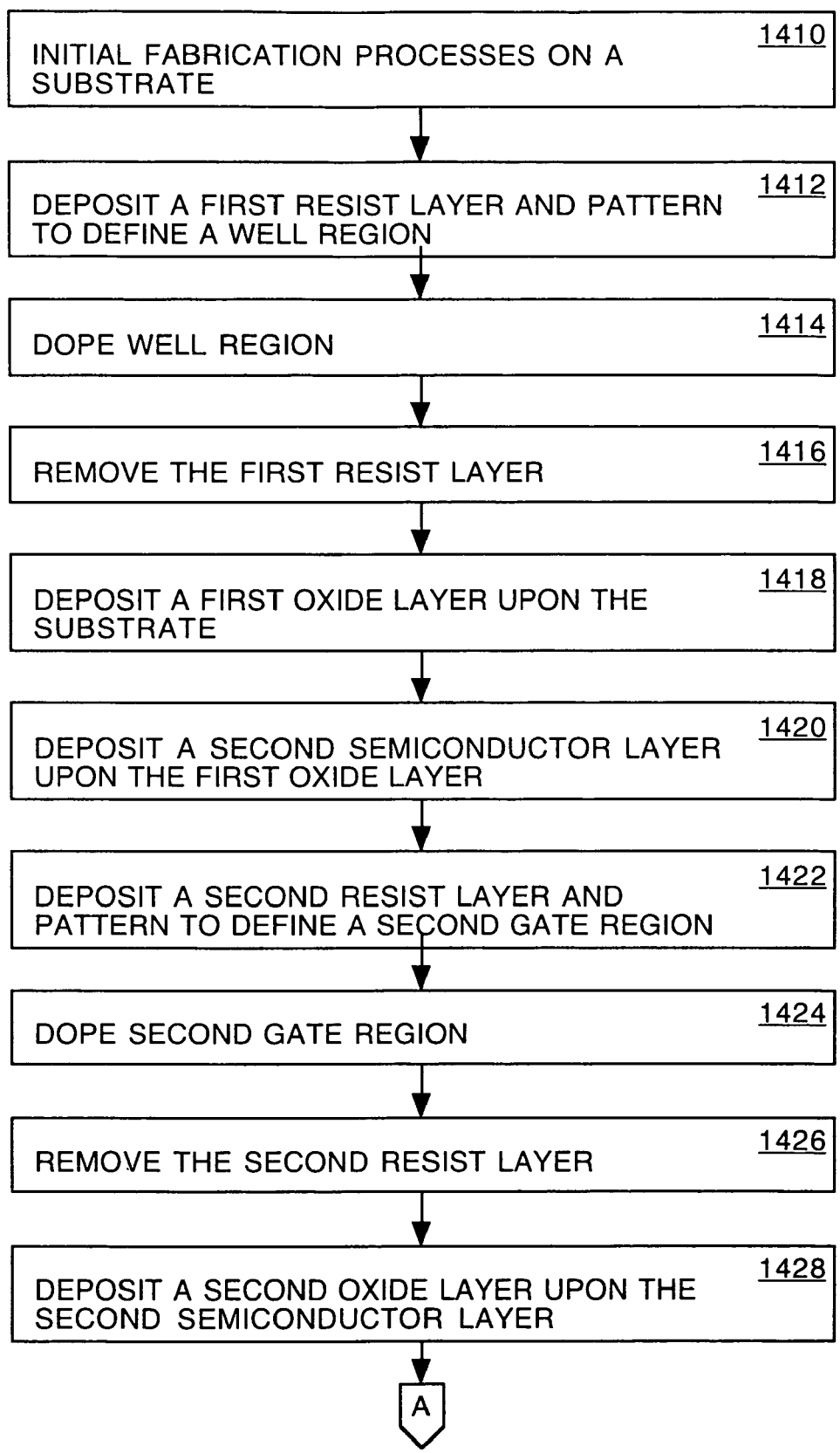
FIGS. 14A, 14B, 14C and 14D show a flow diagram of steps in a method of fabricating a complementary FET, in accordance with one embodiment of the present invention.
Figure 14B:
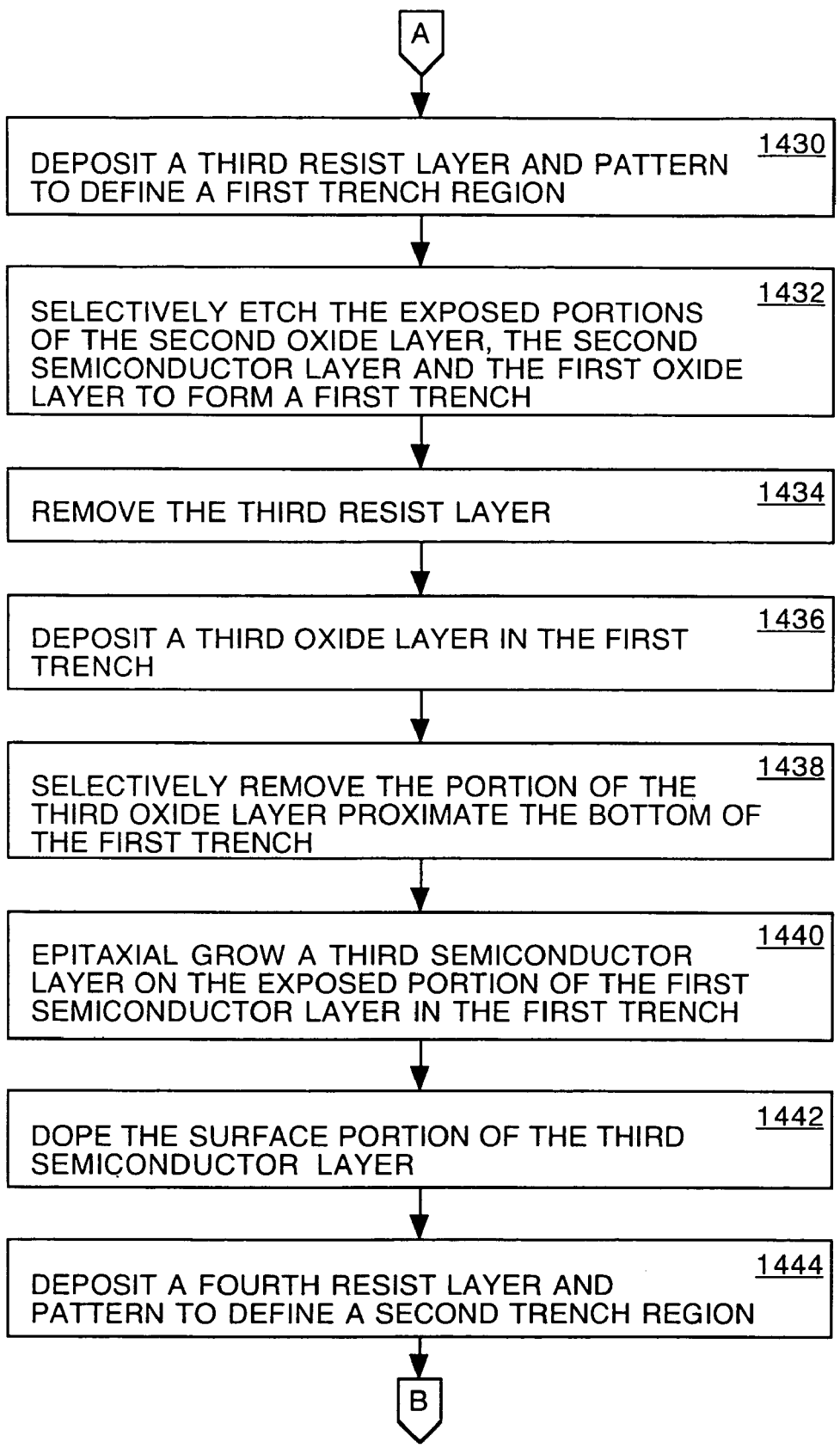
Figure 14C:
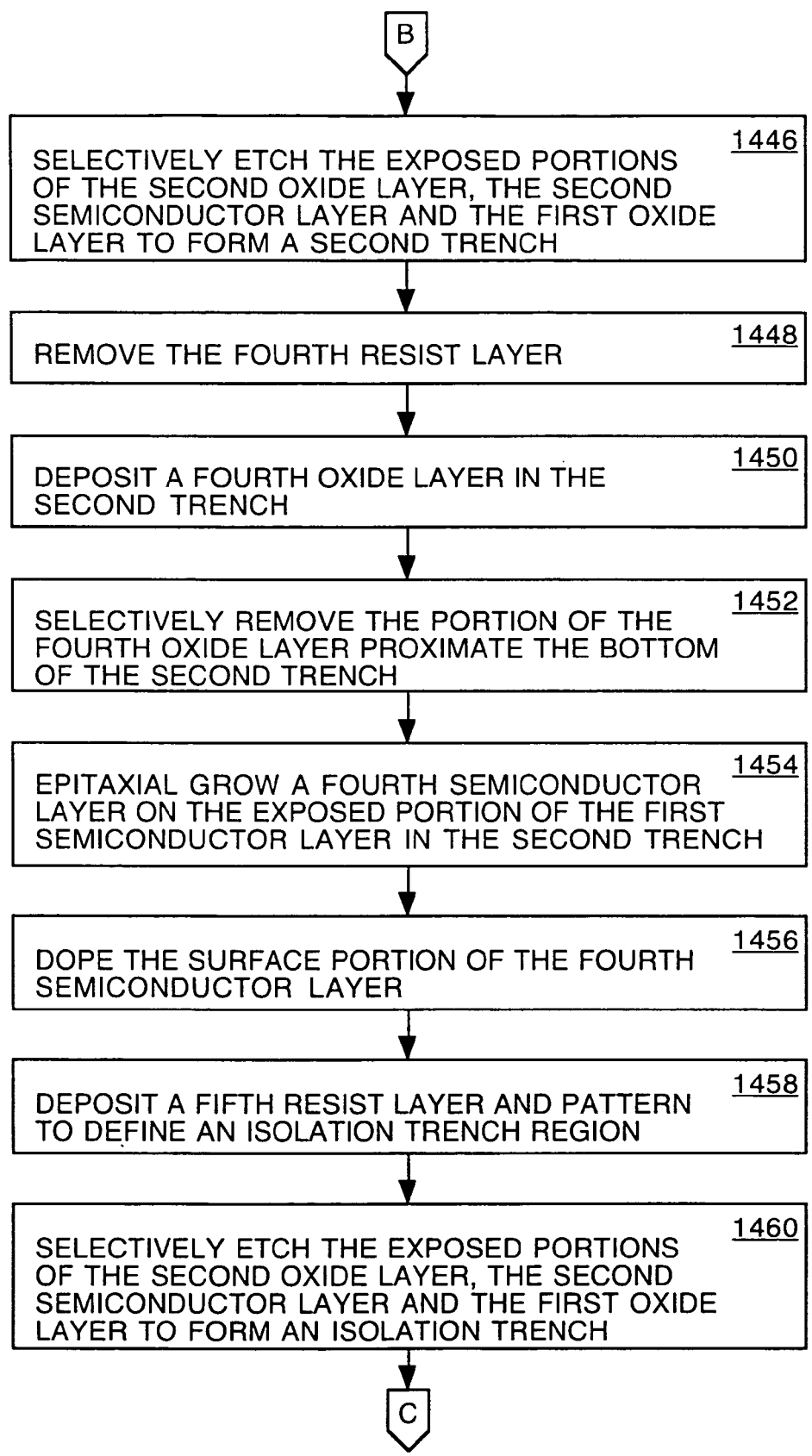
Figure 14D:
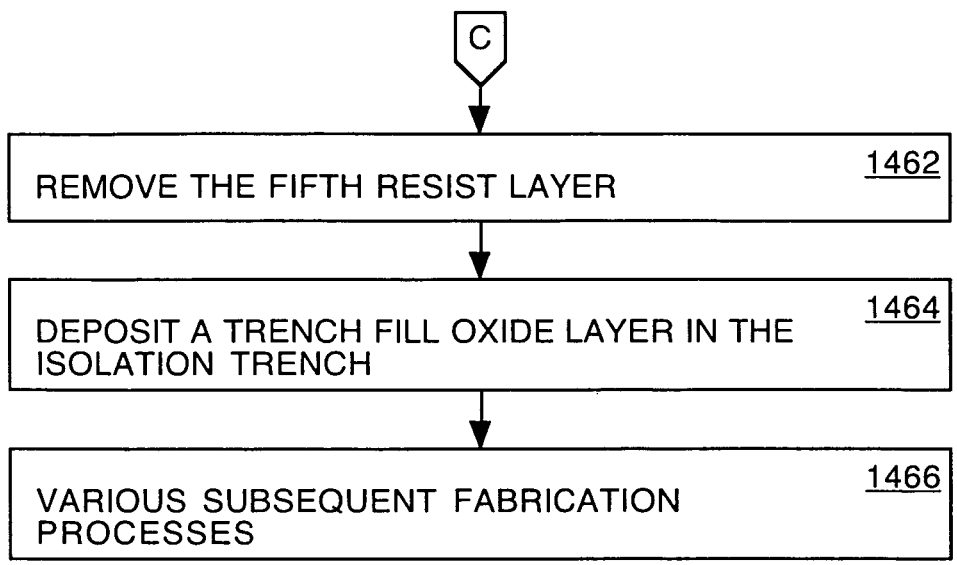

Referring now to FIGS. 14A, 14B, 14C and 14D, a flow diagram of a method of fabricating complementary field effect transistor (FET), in accordance with one embodiment of the present invention, is shown. As depicted in FIGS. 14A, 14B and 14C, the method may begin, at 1410, with various initial processes upon a semiconductor substrate (e.g., a first semiconductor layer). The various initial processes may include cleaning, depositing, etching and/or the like. The semiconductor substrate may include a first type of dopant at a first concentration. In one implementation, the substrate may be silicon, gallium arsenide, indium phosphide or the like, heavily doped with Phosphorus or Arsenic (N+) at a concentration of approximately $5.0E16 \text{ cm}^{-3}$ to $5.0E19 \text{ cm}^{-3}$.

At 1412, a first photo-resist may be deposited and patterned by any well known photolithography process to form a first resist layer. In one implementation, the first resist layer defines a well region. At 1414, the portion of the first semiconductor layer exposed by the first resist layer (e.g., well region) may be doped utilizing any well known implanting process. In one implementation, the well region may be heavily doped with Boron (P+) at a concentration of $1.0E17 \text{ cm}^{-3}$ to $1.0E20 \text{ cm}^{-3}$. At 1416, the first resist layer may be removed utilizing an appropriate resist stripper or resist ashing process.

At, 1418, a first dielectric layer may be deposited upon the substrate. In one implementation, the first dielectric layer may be approximately 15 nm to 3 µm. In one implementation, the first dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the first dielectric layer may be formed by any well known thermal oxidation process. In yet another implementation, the first dielectric layer may be formed by a thermal oxidation process followed by a deposition process.

At 1420, a second semiconductor layer may be deposited upon the first dielectric layer. In one implementation, the second semiconductor layer may be a polysilicon layer approximately 15 nm to 1 µm. The polysilicon layer may be deposited by chemical vapor deposition (CVD) or the like process. In one implementation, the polysilicon layer may be heavily doped with Boron (P+) at a concentration of approximately $5.0E16 \text{ cm}^{-3}$ to $1.0E20 \text{ cm}^{-3}$. The doping may be performed in-situ during the deposition process or in a separate well known implanting process.

At 1422, a second photo-resist may be deposited and patterned by any well known photolithography process to form a second resist layer. In one implementation, the second resist layer defines a second gate region. It is appreciated that the unexposed portion of the second semiconductor layer may be utilized as a first gate region. At 1424, the portion of the second semiconductor layer exposed by the second resist layer may be doped utilizing any well known implanting process to form the second gate region. In one implementation, the second gate region may be heavily doped with Phosphorus or Arsenic (N+). At 1426, the second resist layer may be removed utilizing an appropriate resist stripper or resist ashing process.

At 1428, a second dielectric layer may be deposited upon the second semiconductor layer. In one implementation, the second dielectric layer may be approximately 15 nm to 3 µm thick. In one implementation, the second dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the second dielectric layer may be formed by any well known thermal oxidation process. In yet another implementation, the second dielectric layer may be formed by a thermal oxidation process followed by a deposition process.

At 1430, a third photo-resist may be deposited and patterned by any well known photolithography process to form a third resist layer. In one implementation, the third resist layer defines a first trench outside the well region portion of the first semiconductor layer. At 1532, the portions of the second dielectric layer, the second semiconductor layer and the first dielectric layer exposed by the third resist layer may be removed by any-well known etching process. In one implementation, the first trench may extend to the surface of the first semiconductor layer. In another implementation, a portion of the substrate may also be etched, such that the first trench extends partially into the substrate. At 1434, the third resist layer may be removed utilizing an appropriate resist stripper or resist ashing process.

At 1436, a third dielectric layer may be deposited in the first trench. In one implementation, the third dielectric layer may be approximately 15 nm to 100 nm thick. In one implementation, the third dielectric layer may be formed by any well known deposition process, such as oxidation, chemical vapor deposition of a high-dielectric-constant material (e.g., BST, PZT, etc.) and/or the like. At 1438, a portion of the third dielectric layer proximate the bottom of the trench may be selectively removed.

At 1440, a third semiconductor layer may be formed in the first trench. In one implementation, the third semiconductor layer may be an epitaxial grown semiconductor. The third semiconductor layer may be selectively grown, utilizing a chemical vapor deposition or molecular beam epitaxy process, upon the exposed portions of the substrate. The epitaxial grown third semiconductor layer may be silicon, or a material having higher mobility, such gallium arsenide, indium phosphide or the like. In one implementation, the third semiconductor layer may be lightly doped with Phosphorus or Arsenic (N−), having a concentration of approximately $1.0E16$ $cm^{-3}$ to $4.0E16$ $cm^{-3}$. The doping may be performed in-situ during the deposition process or in a separate implant process.

It is appreciated that the third semiconductor and first semiconductor materials may be selected to generate a strained third semiconductor layer. For example, the first semiconductor material may be a silicon substrate and the third semiconductor layer may be epitaxial deposited silicon germanium, the first semiconductor material may be a gallium arsenide substrate and the third semiconductor layer may be gallium indium arsenide, or the like combinations.

At 1442, a portion of the third semiconductor layer proximate the third dielectric layer may be heavily n-doped utilizing any well known implant process. In another implementation, the portion of the third semiconductor layer, proximate the third dielectric layer, may be heavily n-doped by increasing the impurity concentration during the epitaxial deposition at step 1440.

At 1444, a fourth photo-resist may be deposited and patterned by any well known lithography process to form a fourth resist layer. In one implementation, the fourth resist layer defines a second trench region proximate the well region in the first semiconductor layer. At 1446, the portions of the second dielectric layer, the second semiconductor layer and the first dielectric layer exposed by the fourth resist layer may be removed by any-well known etching process. In one implementation, the trench may extend to the surface of the well region. In another implementation, a portion of the substrate may also be etched, such that the resulting trench extends partially into the well region. At 1448, the fourth resist layer may be removed utilizing an appropriate resist stripper or resist ashing process.

At 1450, a fourth dielectric layer may be deposited in the second trench. In one implementation, the fourth dielectric layer may be approximately 15 nm to 100 nm thick. In one implementation, the fourth dielectric layer may be formed by any well known deposition process, such as oxidation, chemical vapor deposition of a high-dielectric-constant material (e.g., BST, PZT, etc.) and/or the like. At 1452, a portion of the fourth dielectric layer proximate the bottom of the trench is selectively removed.

At 1454, a fourth semiconductor layer may be formed in the second trench. In one implementation, the fourth semiconductor layer may be an epitaxial grown semiconductor. The fourth semiconductor layer may be selectively grown, utilizing a chemical vapor deposition or molecular beam epitaxy process, upon the exposed portions of the well region. The epitaxial grown fourth semiconductor layer may be silicon, or a material having higher mobility, such gallium arsenide, indium phosphide or the like. In one implementation, the fourth semiconductor layer may be lightly doped with Boron (P−), having a concentration of approximately $1.0E16$ $cm^{-3}$ to $4.0E16$ $cm^{-3}$. The doping may be performed in-situ during the deposition process or in a separate implant process.

It is appreciated that the fourth semiconductor and first semiconductor materials may be selected to generate a strained third semiconductor layer. For example, the first semiconductor material may be a silicon substrate and the fourth semiconductor layer may be epitaxial deposited silicon germanium, the first semiconductor material may be a gallium arsenide substrate and the third semiconductor layer may be gallium indium arsenide, or the like combinations.

At 1456, a portion of the fourth semiconductor layer proximate the third dielectric layer may be heavily p-doped utilizing any well known implant process. In another implementation, the portion of the fourth semiconductor layer may be heavily p-doped by increasing the impurity concentration during the epitaxial deposition at step 1454.

At 1458, a fifth photo-resist may be deposited and patterned by any well known photolithography process to form a fifth resist layer. In one implementation, the fifth resist layer defines a trench isolation region. At 1460, the portions of the second dielectric layer, the second semiconductor layer and the first dielectric layer exposed by the fifth resist layer may be removed by any-well known etching process. In one implementation, a portion of the substrate may also be etched, such that the isolation trench extends partially into the substrate. At 1462, the fifth resist layer may be removed utilizing an appropriate resist stripper or resist ashing process.

At 1464, a dielectric fill may be deposited in the isolation trench. In one implementation, the dielectric fill may be formed by any well known deposition process, such as decomposition of tetraethylorthosilicate (TEOS), high-density plasma deposition (HDP), oxide-nitride-oxide (ONO), spin-on glass (SOG), flowable oxide and/or the like. At 1466, the method continues with various other processes. The various other processes typically include passivation, etching, doping, metalization, cleaving and/or the like.

Figure 15:
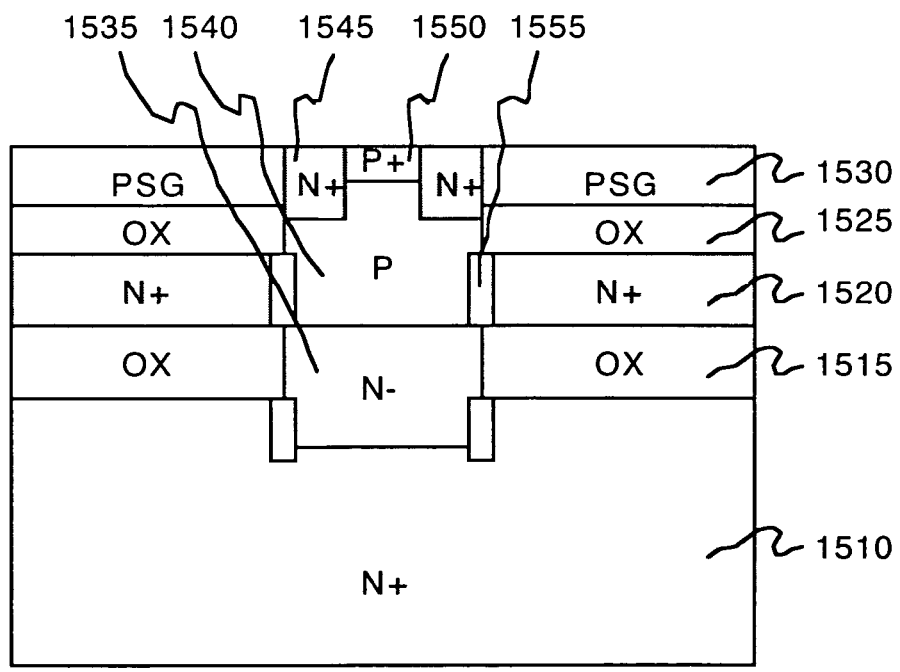
FIG. 15 shows a sectional view block diagram of a FET, in accordance with one embodiment of the present invention.

Referring now to FIG. 15, a block diagram of a field effect transistor (FET), in accordance with one embodiment of the present invention, is shown. As depicted in FIG. 15, the FET includes a first semiconductor layer (e.g., substrate) 1510, a first dielectric layer 1515, a second semiconductor layer 1520, a second dielectric layer 1525, 1530 a third semiconductor layer 1535-1550 and a third dielectric layer 1555. The first dielectric layer 1515 may be disposed upon the first semiconductor layer 1510. The second semiconductor layer 1520 may be disposed upon the first dielectric layer 1515 opposite the semiconductor layer 1510. The second dielectric layer 1525, 1530 may be disposed upon the second semiconductor layer 1520 opposite the first dielectric layer 1515. The third semiconductor layer 1535-1550 may be disposed upon the first semiconductor layer 1510 between a first and second portion of the first dielectric layer 1515, a first and second portion of the second semiconductor layer 1520 and a first and second portion of the second dielectric layer 1525, 1530. The third semiconductor layer 1535-1550 may also partially extend into the first semiconductor layer 1510. The third dielectric layer 1555 may be disposed between the third semiconductor layer 1535-1550 and the first and second portions of the second semiconductor layer 1520. The third dielectric layer 1555 may also be partially disposed between portions of the third semiconductor layer 1535-1550 and portions of the first semiconductor layer 1510.

In one implementation, the first semiconductor layer 1510 (e.g., drain region) may be silicon, gallium arsenide, indium phosphide or the like heavily n-doped with Phosphorus, Arsenic or the like. The second semiconductor layer 1520 (e.g., gate region) may be polysilicon heavily n-doped with Phosphorus, Arsenic or the like. The first and second dielectric layers 1515, 1525, 1530 may be silicon dioxide, oxide-nitride-oxide (ONO), a spin-on glass (SOG), a flowable oxide, a high-dielectric-constant material (e.g., BST, PZT, etc.) and/or the like. The third dielectric layer 1555 may be silicon dioxide, a high-dielectric-constant material (e.g., BST, PZT, etc.) or the like. A first portion of the third semiconductor layer 1535 (e.g., drift region), proximate the first semiconductor layer 1510 and the first dielectric layer 1515, may be silicon, gallium arsenide, indium phosphide or the like lightly n-doped with Phosphorus, Arsenic or the like. A second portion of the third semiconductor layer 1545 (e.g., body region), proximate the second semiconductor layer 1520, may be moderately p-doped with Boron or the like. A third and fourth portion of the third semiconductor layer 1545 (e.g., source regions), proximate the second dielectric layer 1525, 1530 may be heavily n-doped with Phosphorus, Arsenic or the like. A fifth portion of the third semiconductor layer 1550 (e.g., body contact region), disposed between the third and fourth portion of the third semiconductor layer 1545, may be heavily p-doped with Boron or the like When the potential of the gate region 1520, with respect to the drain region 1510 is increased above a threshold voltage, a conduction channel is induced in the body region 1540 proximate the gate region 1520. The FET will then conduct current between the source 1545 and the drain regions 1510. Accordingly, the FET is in its on state. When the potential of the gate region 1520 is reduced below the threshold voltage, the channel is no longer induced. As a result, a voltage potential applied between the drain region 1510 and the source regions 1545 will not cause current to flow there between. Accordingly, the FET is in its off state and the junction formed by the body region 1540 and the drain region 1510 supports the voltage applied across the source and drain regions 1510, 1545.

In another implementation (not shown), the first semiconductor layer (e.g., drain region) may be silicon, gallium arsenide, indium phosphide or the like heavily p-doped with Boron or the like. The second semiconductor layer may be polysilicon heavily p-doped with Boron or the like. The first and second dielectric layers may be silicon dioxide, oxide-nitride-oxide (ONO), a spin-on glass (SOG), a flowable oxide, a high-dielectric-constant material (e.g., BST, PZT, etc.) and/or the like. The third dielectric layer may be silicon dioxide. A first portion of the third semiconductor layer (e.g., drift region), proximate the first semiconductor layer and the first dielectric layer, may be silicon, gallium arsenide, indium phosphide or the like lightly p-doped with Boron or the like. A second portion of the third semiconductor layer (e.g., body region), proximate the second semiconductor layer, may be moderately n-doped with Phosphorus, Arsenic or the like. A third and fourth portion of the third semiconductor layer (e.g., drain regions), proximate the second dielectric layer may be heavily p-doped with Boron or the like. A fifth portion of the third semiconductor layer (e.g., body contact region), disposed between the third and fourth portion of the third semiconductor layer, may be heavily n-doped with Phosphorus, Arsenic or the like.

When the potential of the gate region, with respect to the drain region, is decreased below a threshold voltage, a conduction channel is induced in the body region proximate the gate region. The FET will then conduct current between the source and the drain regions. Accordingly, the FET is in its on state. When the potential of the gate region is increased above the threshold voltage, the channel is no longer induced. As a result, a voltage potential applied between the drain region and the source region will not cause current to flow there between. Accordingly, the FET is in its off state and the junction formed by the body region and the source region supports the voltage applied across the source and drain regions.

Figure 16A:
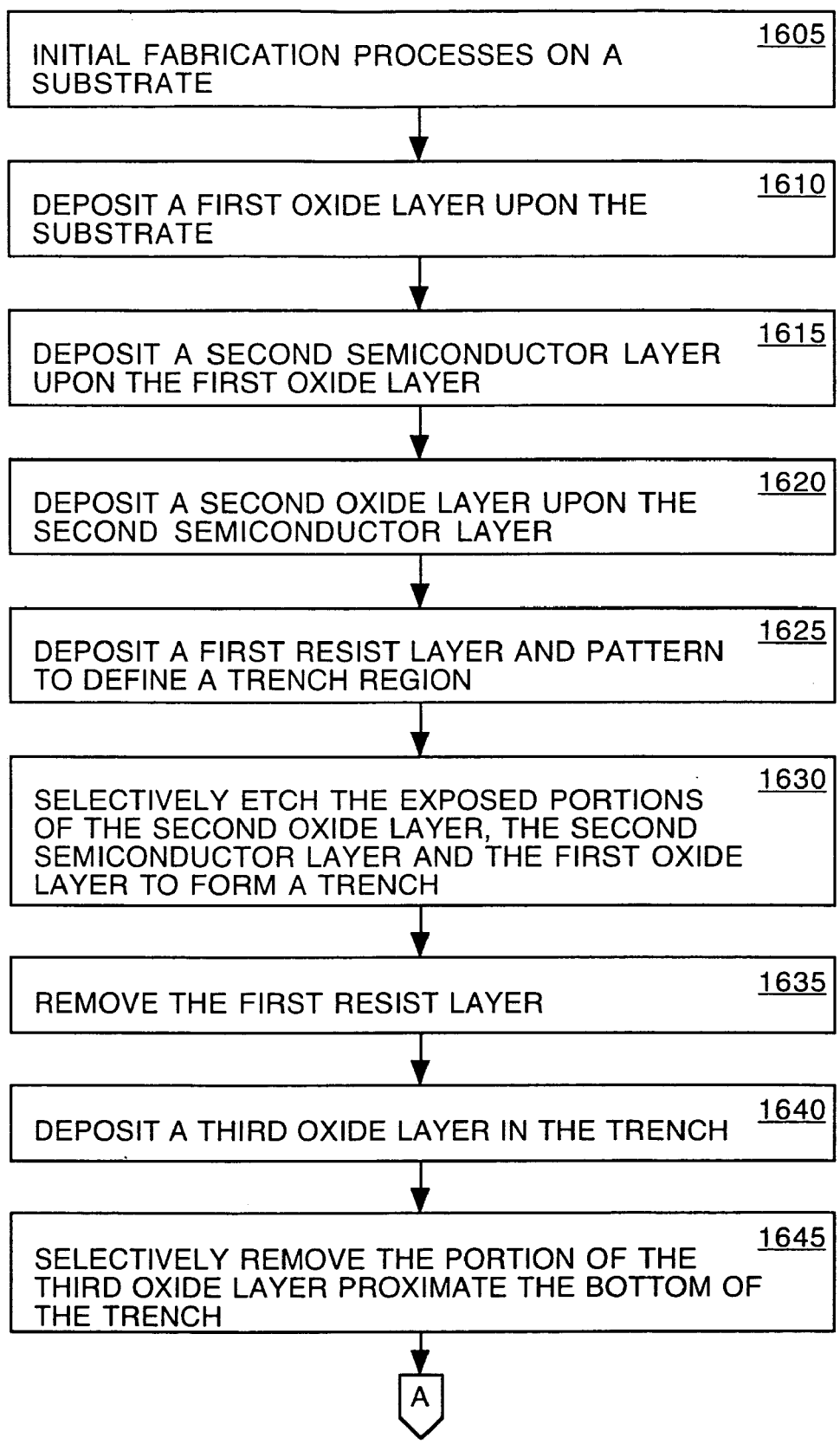
FIGS. 16A and 16B show a flow diagram of steps in a method of fabricating a FET, in accordance with one embodiment of the present invention.
Figure 16B:
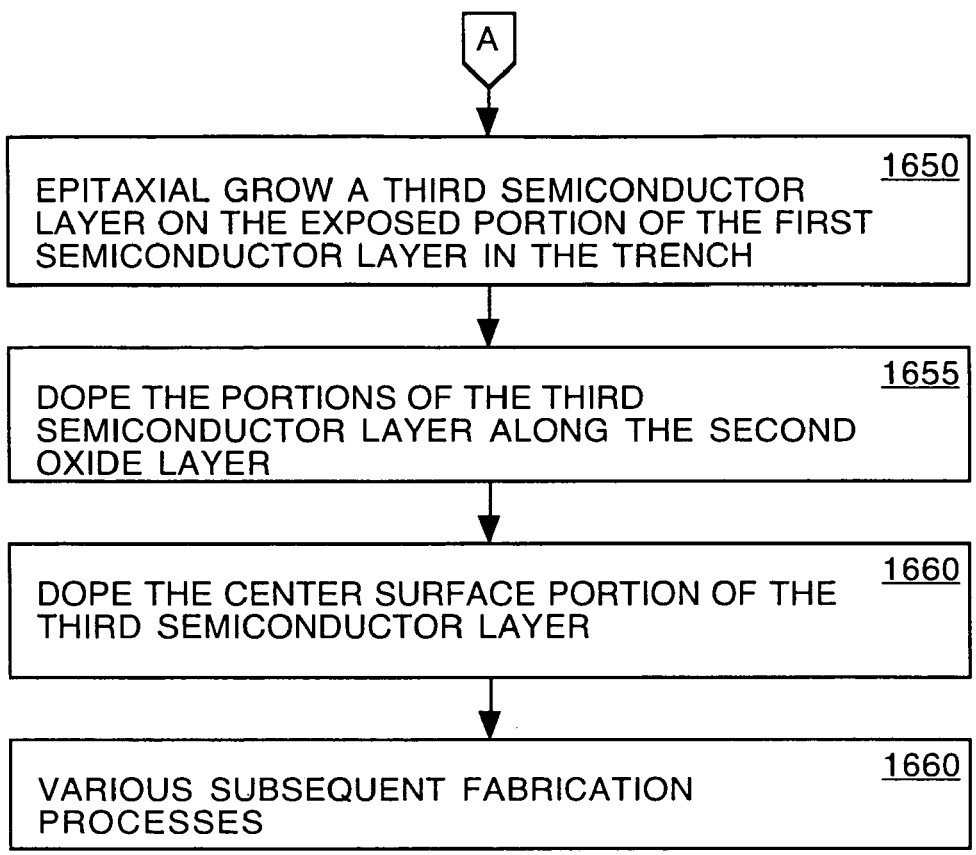

Referring now to FIGS. 16A and 16B, a flow diagram of a method of fabricating a field effect transistor (FET), in accordance with one embodiment of the present invention, is shown. As depicted in FIGS. 16A and 16B, the method may begin, at 1605, with various initial processes upon a semiconductor substrate (e.g., a first semiconductor layer). The various initial processes may include cleaning, depositing, etching and/or the like. The semiconductor substrate may include a first type of dopant at a first concentration. In an n-channel implementation, the substrate may be silicon, gallium arsenide, indium phosphide or the like, heavily doped with Phosphorus or Arsenic (N+) at a concentration of approximately $5.0E16\ cm^{-3}$ to $1.0E20\ cm^{-3}$. In a p-channel implementation, the substrate may be silicon, gallium arsenide, indium phosphide or the like, heavily doped with Boron (P+).

At 1610, a first dielectric layer may be deposited upon the substrate. In one implementation, the first dielectric layer may be approximately 15 nm to 3 µm. In one implementation, the first dielectric layer may be formed by any well known deposition process, such as decomposition of tetraethylorthosilicate (TEOS), high-density plasma deposition (HDP), oxide-nitride-oxide (ONO), spin-on glass (SOG), flowable oxide, chemical vapor deposition of a high-dielectric-constant material (e.g., BST, PZT, etc.) and/or the like. In another implementation, the first dielectric layer may be formed by any well known thermal oxidation process. In yet another implementation, the first dielectric layer may be formed by a thermal oxidation process followed by a deposition process.

At 1615, a second semiconductor layer may be deposited upon the dielectric layer. In one implementation, the second semiconductor layer may be a polysilicon layer approximately 15 nm to 1 µm. The polysilicon layer may be deposited by chemical vapor deposition (CVD) or the like process. In an n-channel implementation, the polysilicon layer may be heavily doped with Phosphorus or Arsenic (N+) at a concentration of approximately $5.0E16\ cm^{-3}$ to $1.0E20\ cm^{-3}$. In a p-channel implementation, the polysilicon layer may be heavily doped with Boron (P+). The doping may be performed in-situ during the deposition process or in a separate well known implanting process.

At 1620, a second dielectric layer may be deposited upon the second semiconductor layer. In one implementation, the second dielectric layer may be approximately 15 nm to 3 μm thick. In one implementation, a first portion the second dielectric layer may be formed by any well known thermal oxidation process. A second portion of the second dielectric layer may be formed by any well known spin-on glass (SOG) process. In an n-channel implementation, the spin-on glass may be heavily n-doped with Phosphorus or the like. In a p-channel implementation, the spin-on glass may be heavily p-doped with Boron or the like.

At 1625, a first photo-resist may be deposited and patterned by any well known lithography process to form a first resist layer. In one implementation, the first resist layer defines a trench region. In another implementation, the first resist layer defines a plurality of substantially parallel linear trenches. In yet another implementation, the first resist layer defines a plurality of trenches bounding a plurality of closed cells (e.g., mess, hexagonal, etc.). At 1630, the portions of the second dielectric layer, the second semiconductor layer and the first dielectric layer exposed by the first resist layer may be removed by any-well known etching process. In one implementation, the trench may extend to the surface of the first semiconductor layer. In another implementation, a portion of the substrate may also be etched, such that the resulting trench extends partially into the substrate. At 1635, the first resist layer may be removed utilizing an appropriate resist stripper or resist ashing process.

At 1640, a third dielectric layer may be grown in the first and second semiconductor layers proximate the trenches. In one implementation, the third dielectric layer may be approximately 15 nm to 200 nm thick. In one implementation, the third dielectric layer may be grown by any well known oxidation process. At 1645, a portion of the third dielectric layer proximate the bottom of the trenches is selectively removed. In one implementation, the portion of the third dielectric layer proximate the bottom of the trenches may be selectively removed utilizing any well known anisotropic etching process, such as plasma or reactive-ion etching. It is appreciated that the thermal oxidation of the second semiconductor layer, at process 1640, results in the third dielectric layer that extends approximately half into and half out of the second semiconductor layer. The portion that extends into the second semiconductor layer is masked from etching by the second dielectric layer. Accordingly, after the anisotropic etching process approximately half the original thickness of the third dielectric layer will remain along the surface of the second semiconductor layer while the portion of the third dielectric layer proximate the bottom of the trenches will be removed.

At 1650, a third semiconductor layer may be formed in the trenches. In one implementation, the third semiconductor layer may be an epitaxial grown semiconductor. The third semiconductor layer may be selectively grown, utilizing a chemical vapor deposition or molecular beam epitaxy process, upon the exposed portions of the substrate. The epitaxial grown third semiconductor layer may be silicon, or a material having higher mobility, such gallium arsenide, indium phosphide or the like. In an n-channel implementation, a first portion of the third semiconductor layer, proximate the first semiconductor layer and the first dielectric layer, may be lightly n-doped with Phosphorus, Arsenic or the like, having a concentration of approximately $1.0\text{E}16\text{ cm}^{-3}$ to $1.0\text{E}17\text{ cm}^{-3}$. The n-doping may be performed in-situ during the epitaxial process. A second third semiconductor layer, proximate the second semiconductor layer, may be moderately p-doped with Boron or the like, having a concentration of $1.0\text{E}16\text{ cm}^{-3}$ to $1.0\text{E}17\text{ cm}^{-3}$, in a second portion. The p-doping may also be performed in-situ during the epitaxial process or in a separate implant process. In a p-channel implementation, a first portion of the third semiconductor layer, proximate the first semiconductor layer and the first dielectric layer, may be lightly p-doped with Boron or the like. The p-doping may be performed in-situ during the epitaxial process. A second portion of the third semiconductor layer, proximate the second semiconductor layer, may be moderately n-doped with Phosphorus, Arsenic or the like. The n-doping may also be performed in-situ during the epitaxial process or in a separate implant process.

It is appreciated that the third semiconductor and first semiconductor materials may be selected to generate a strained third semiconductor layer. For example, the first semiconductor material may be a silicon substrate and the third semiconductor layer may be epitaxial deposited silicon germanium, the first semiconductor material may be a gallium arsenide substrate and the third semiconductor layer may be gallium indium arsenide, or the like combinations.

At 1655, a third and fourth portion of the third semiconductor layer, proximate the second dielectric layer, may be heavily doped. In one implementation, the third and fourth portion of the third semiconductor layer proximate the third dielectric layer may be doped utilizing any well known photolithographic masking and selective implanting processes. In another implementation, the third and fourth portion of the third semiconductor layer may be heavily doped by diffusion of dopant from the second dielectric layer. The diffusion may occur during the epitaxial deposition process at 1650 or during a separate thermal cycle. In an n-channel implementation, a portion of the second dielectric layer may be Phosphorus doped spin-on-glass (PSG). The Phosphorus contained in the spin-on-glass may diffuse such that the adjacent portion of the third semiconductor layer may be heavily n-doped at a concentration of approximately $1.0\text{E}17\text{ cm}^{-3}$ to $1.0\text{E}20\text{ cm}^{-3}$. In a p-channel implementation, the portion of the second dielectric layer may be Boron doped spin-on-glass. The Boron contained in the spin-on-glass may diffuse such that the adjacent portion of the third semiconductor layer may be heavily p-doped.

At 1660, a fifth portion of the third semiconductor layer, between the third and fourth portions of the third semiconductor layer, may be heavily doped. In one implementation, the fifth portion of the third semiconductor layer may be heavily doped utilizing any well known photolithographic masking and selective implanting processes. In an n-channel implementation, Boron or the like may be selectively implanted between the third and fourth portions of the third semiconductor layer, at a concentration of $5.0\text{E}16\text{ cm}^{-3}$ to $1.0\text{E}20\text{ cm}^{-3}$. In a p-channel implementation, Phosphorus, Arsenic or the like may be selectively implanted between the third and fourth portion of the third semiconductor layer. At 1665, the method continues with various other processes. The various other processes typically include passivation, etching, doping, metalization, cleaving and/or the like.

Accordingly, embodiments of the present invention advantageously provide a FET having a channel length that is dependent upon the thin film thickness of a gate layer. The reduced gate dimension results in reduced gate capacitance. Thus, the FETs, in accordance with embodiments of the present invention, may advantageously be utilized in fast switching applications. The smaller channel width also advantageously enables use of increase doping levels without changing the gate oxide thickness. Accordingly, reduced channel resistance can be achieved in the FETs in accordance with embodiments of the present invention. Embodiments of the present invention also advantageously provide FETs having a gate oxide layer. The gate oxide layer advantageously reduces gate leakage current and increases the drain current.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A field effect transistor comprising:
   a first semiconductor layer of a first conductivity type;
   a first dielectric layer disposed upon said first semiconductor layer;
   a second semiconductor layer of a second conductivity type disposed upon said first dielectric layer wherein said first semiconductor layer and said second semiconductor layer are disposed on two opposite surfaces of said first dielectric layer;
   a second dielectric layer disposed upon said second semiconductor layer wherein said first dielectric layer and said second dielectric layer are disposed on two opposite surfaces of said second semiconductor layer; and
   a third semiconductor layer of said first conductivity type disposed upon said first semiconductor layer, wherein a first portion of the third semiconductor layer of said first conductivity type is between a first and a second portion of said first dielectric layer, a second portion of the third semiconductor layer of said first conductivity type is between a first and a second portion of said second semiconductor layer and a third portion of the third semiconductor layer of said first conductivity type is between a first and a second portion of said second dielectric layer.

2. The field effect transistor according to claim 1, wherein said third semiconductor layer comprises:
   a first portion, having a heavy doping concentration, disposed proximate said second dielectric layer; and
   a second portion, having a moderate doping concentration, disposed proximate said second semiconductor layer said first dielectric layer and said first semiconductor layer.

3. The field effect transistor according to claim 1, wherein:
   said first semiconductor layer comprises a heavily n-doped semiconductor;
   said second semiconductor layer comprises a heavily p-doped semiconductor; and
   said third semiconductor layer comprises a moderately n-doped semiconductor.

4. The field effect transistor according to claim 1, wherein:
   said first semiconductor layer further comprises a heavily p-doped semiconductor;
   said second semiconductor layer further comprises a heavily n-doped semiconductor;
   and
   said third semiconductor layer further comprises a moderately p-doped semiconductor.

5. The field effect transistor according to claim 1, wherein said third semiconductor layer comprises a strained semiconductor layer.

6. The field effect transistor according to claim 1, wherein said third semiconductor layer partially extends into said first semiconductor layer.

7. The field effect transistor according to claim 1, further comprising a third dielectric layer disposed between said third semiconductor layer and said first and second portions of said second semiconductor layer.

8. The field effect transistor according to claim 1 further comprising a third dielectric layer disposed between said third semiconductor layer and said first and second portion of said second dielectric layer, said first and second portions of said second semiconductor layer and said first and second portions of the first dielectric layer.

9. A field effect transistor comprising:
   a first semiconductor layer comprising a first portion of a first conductivity type;
   a first dielectric layer disposed upon said first semiconductor layer;
   a second semiconductor layer comprising a first and second portion of a second conductivity type, wherein said second semiconductor layer is disposed upon said first dielectric layer;
   a second dielectric layer disposed upon said second semiconductor layer;
   a third semiconductor layer of a first conductivity type disposed upon said first portion of said first semiconductor layer, wherein a first portion of the third semiconductor layer of said first conductivity type is between a first and a second portion of said first dielectric layer, a second portion of the third semiconductor layer of said first conductivity type is between said first and second portions of said second semiconductor layer and a third portion of the third semiconductor layer of said first conductivity type is between a first and a second portion of said second dielectric layer; and
   a third dielectric layer disposed between said third semiconductor layer and said first and second portions of said second semiconductor layer.

10. The field effect transistor according to claim 9, wherein:
    said first portion of said first semiconductor layer comprises a heavily n-doped semiconductor; and
    said first and second portions of said second semiconductor layer comprise a heavily p-doped semiconductor; and further comprising:
    a first portion of said third semiconductor layer proximate said second semiconductor layer comprises a moderately n-doped semiconductor; and
    a second portion of said third semiconductor layer proximate said second dielectric layer comprises a heavily n-doped semiconductor.

11. The field effect transistor according to claim 9, wherein:
    said first semiconductor layer further comprises a second portion of said second conductivity type; and
    said second semiconductor layer further comprises a third and fourth portion of said first conductivity type; and further comprising;
    a fourth semiconductor layer of said second conductivity type disposed upon said second portion of said first semiconductor layer between a third and a fourth portion of said first dielectric layer, said third and said fourth portions of said second semiconductor layer and a third and a fourth portion of said second dielectric layer; and
    a fourth dielectric layer disposed between said fourth semiconductor layer and said third and said fourth portions of said second semiconductor layer.

12. The field effect transistor according to claim 11, wherein:

said first portion of said first semiconductor layer comprises a heavily n-doped semiconductor;

said second portion of said first semiconductor layer comprises a heavily p-doped semiconductor;

said first and second portions of said second semiconductor layer comprise a heavily p-doped semiconductor;

said third and fourth portions of said second semiconductor layer comprise a heavily n-doped semiconductor; and Further comprising;

a first portion of said third semiconductor layer proximate said second semiconductor layer comprises a moderately n-doped semiconductor;

a second portion of said third semiconductor layer proximate said second dielectric layer comprises a heavily n-doped semiconductor;

a first portion of said fourth semiconductor layer proximate said second semiconductor layer comprises a moderately p-doped semiconductor; and a second portion of said fourth semiconductor layer proximate said second dielectric layer comprises a heavily p-doped semiconductor.

13. The field effect transistor according to claim 9, wherein said third semiconductor layer comprise:

a lightly n-doped first portion disposed upon said first semiconductor layer between said first and second portions of said first oxide layer;

a moderately p-doped second portion disposed between said first and second portions of said second semiconductor layer;

a heavily n-doped third and fourth portion disposed between said first and second portions of said second dielectric layer; and a heavily p-doped fifth portion disposed between said third and said fourth heavily n-doped portions.

14. The field effect transistor according to claim 9, wherein said third semiconductor layer comprises:

a lightly p-doped first portion disposed upon said first semiconductor layer between said first and second portions of said first oxide layer;

a moderately n-doped second portion disposed between said first and second portions of said second semiconductor layer;

a heavily p-doped third and fourth portion disposed between said first and second portions of said second dielectric layer; and a heavily n-doped fifth portion disposed between said third and said fourth heavily n-doped portions.

15. A field effect transistor comprising:

a drain region of a first conductivity type;

a first dielectric region disposed upon said drain region;

a gate region disposed upon said first dielectric region wherein said drain region and said gate region are disposed on two opposite surfaces of said first dielectric region;

a second dielectric region disposed directly upon said gate region wherein said first dielectric region and said second dielectric region are disposed on two opposite surfaces of said gate region;

a drift region of the first conductivity type disposed upon said drain region, wherein the drift region of the first conductivity type is exclusively between a first and a second portion of said first dielectric region;

a body region of a second conductivity type disposed upon said drift region, wherein the body region of the second conductivity type is between a first and a second portion of said gate region;

a source region of the first conductivity type disposed upon said body region, wherein the source region of the first conductivity type is between a first and a second portion of said second dielectric region; and a body contact region of the second conductivity type disposed upon said body region, wherein the body contact region of the second conductivity type is between a first and a second portion of said source region.

16. The field effect transistor according to claim 15, wherein:

said drain region comprises a heavily n-doped first semiconductor layer;

said gate region comprises a heavily n-doped second semiconductor thin film;

said drift region comprises a lightly n-doped portion of a third semiconductor layer;

said body region comprises a moderately p-doped portion of said third semiconductor layer;

said source region comprises a heavily n-doped portion of said third semiconductor layer; and said body contact region comprises a heavily p-doped portion of said third semiconductor layer.

17. The field effect transistor according to claim 15, wherein:

said drain region comprises a heavily p-doped first semiconductor layer;

said gate region comprises a heavily p-doped second semiconductor thin film;

said drift region comprises a lightly p-doped portion of a third semiconductor layer;

said body region comprises a moderately n-doped portion of said third semiconductor layer;

said source region comprises a heavily p-doped portion of said third semiconductor layer; and said body contact region comprises a heavily n-doped portion of said third semiconductor layer.

* * * * *

UNITED STATES PATENT AND TRADEMARK OFFICE
CERTIFICATE OF CORRECTION

PATENT NO. : 7,608,888 B1  Page 1 of 1
APPLICATION NO. : 11/149716
DATED : October 27, 2009
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 872 days.

Signed and Sealed this

Twelfth Day of October, 2010

David J. Kappos
*Director of the United States Patent and Trademark Office*